US011171240B2

United States Patent
Sharma et al.

(10) Patent No.: US 11,171,240 B2
(45) Date of Patent: Nov. 9, 2021

(54) RECESSED THIN-CHANNEL THIN-FILM TRANSISTOR

(71) Applicant: Intel Corporation, Santa Clara, CA (US)

(72) Inventors: Abhishek A. Sharma, Hillsboro, OR (US); Van H. Le, Portland, OR (US); Jack T. Kavalieros, Portland, OR (US); Tahir Ghani, Portland, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/646,196

(22) PCT Filed: Oct. 12, 2017

(86) PCT No.: PCT/US2017/056296
§ 371 (c)(1),
(2) Date: Mar. 11, 2020

(87) PCT Pub. No.: WO2019/074506
PCT Pub. Date: Apr. 18, 2019

(65) Prior Publication Data
US 2020/0279953 A1 Sep. 3, 2020

(51) Int. Cl.
*H01L 29/786* (2006.01)
*H01L 23/528* (2006.01)
(Continued)

(52) U.S. Cl.
CPC ...... *H01L 29/78618* (2013.01); *H01L 23/528* (2013.01); *H01L 27/10814* (2013.01);
(Continued)

(58) Field of Classification Search
CPC ............ H01L 29/78618; H01L 23/528; H01L 27/10814; H01L 27/10873;
(Continued)

(56) References Cited

U.S. PATENT DOCUMENTS 9,653,151 B1 5/2017 Ong
2010/0054016 A1* 3/2010 Kajigaya ............. G11C 13/004 365/148
(Continued)

FOREIGN PATENT DOCUMENTS

WO 2019074506 A1 4/2019

OTHER PUBLICATIONS

International Preliminary Report on Patentability dated Apr. 14, 2020 for International Patent Application No. PCT/US2017/056296, 10 pages.
(Continued)

*Primary Examiner* — Edward Chin
(74) *Attorney, Agent, or Firm* — Schwabe, Williamson & Wyatt P.C.

(57) ABSTRACT

A thin-film transistor includes a gate electrode, a gate dielectric on the gate electrode, a first layer including a source region, a drain region, and a semiconductor region above and in direct contact with the gate dielectric and physically connecting the source and drain regions, and a second layer including an insulator material on the semiconductor region. The semiconductor region has less vertical thickness than the source and drain regions. In an embodiment, the thickness of the semiconductor region is no more than half that of the source and drain regions. In another embodiment, the second layer physically connects and electrically separates the source and drain regions. In yet another embodiment, a memory cell includes this transistor and a capacitor electrically connected to the drain region, the
(Continued)

Embedded Memory Cell 300
U-Shaped Capacitor 390
2nd Terminal 394
Dielectric 396
1st Terminal 392
Bitline 270
Storage Node 380
Z X
Source Electrode 150
Capping 170
Drain Electrode 170
Active Layer 140
Source 142
Channel 146
Drain 144
Gate Dielectric 130
Gate 120
Interlayer Dielectric (ILD) 110 gate electrode being electrically connected to a wordline and the source region being electrically connected to a bitline.

20 Claims, 12 Drawing Sheets

(51) Int. Cl.
*H01L 27/108* (2006.01)
*H01L 29/417* (2006.01)
*H01L 29/423* (2006.01)
*H01L 29/49* (2006.01)

(52) U.S. Cl.
CPC .. *H01L 27/10873* (2013.01); *H01L 27/10885* (2013.01); *H01L 27/10891* (2013.01); *H01L 27/10897* (2013.01); *H01L 29/41733* (2013.01); *H01L 29/42384* (2013.01); *H01L 29/4908* (2013.01); *H01L 29/7869* (2013.01); *H01L 29/78669* (2013.01); *H01L 29/78678* (2013.01); *H01L 29/78684* (2013.01); *H01L 29/78696* (2013.01)

(58) Field of Classification Search
CPC ......... H01L 27/10885; H01L 27/10891; H01L 27/10897; H01L 29/41733; H01L 29/42384; H01L 29/4908; H01L 29/78669; H01L 29/78678; H01L 29/78684; H01L 29/7869; H01L 29/78696; H01L 27/1248; H01L 27/1255
See application file for complete search history.

(56) References Cited

U.S. PATENT DOCUMENTS

2017/0084686 A1* 3/2017 Wang .................... H01L 29/495
2017/0162678 A1* 6/2017 Yim ...................... H01L 21/467
2017/0200745 A1* 7/2017 Min .................... H01L 27/1222

OTHER PUBLICATIONS

International Search Report received for PCT Application No. PCT/US2017/056296. dated Jul. 19, 2018. 3 pages.
Written Opinion of the International Searching Authority received for PCT Application No. PCT/US2017/056296. dated Jul. 19, 2018. 9 pages.

* cited by examiner

Thin-Channel TFT 100
Active Layer 140
Source Electrode 150
Source 142
Capping Layer 170
Channel 146
Drain Electrode 160
Drain 144
Gate Dielectric 130
Gate 120
Interlayer Dielectric (ILD) 110
Z
X Embedded Memory 400
BEOL Metal Interconnect Layers 420
Metal 7 Interconnect Portion 460
Metal 7 Via Portion 455
Metal 6 Layer 450
Metal 5 Layer (Bitline and Backend TFT) 445
Metal 4 Layer (Wordline) 440
Metal 3 Layer 435
Metal 2 Layer 430
Metal 1 Layer 425
FEOL – Logic Layers, Circuits, Devices 410
Metal 7 Layer 465
Capacitor 470
Memory Array 490
Memory Peripheral Circuit 480
Z
Y

RECESSED THIN-CHANNEL THIN-FILM TRANSISTOR

CROSS-REFERENCE TO RELATED APPLICATIONS

This patent application is a U.S. National Phase Application under 35 U.S.C. § 371 of International Application No. PCT/US2017/056296, filed on Oct. 12, 2017, the entire contents of which is hereby incorporated by reference herein.

BACKGROUND

A thin-film transistor (TFT) is generally fabricated by depositing thin films of an active semiconductor layer as well as a dielectric layer and metallic contacts over a substrate. There are a number of non-trivial performance issues associated with TFTs.

DETAILED DESCRIPTION

Figure 1:
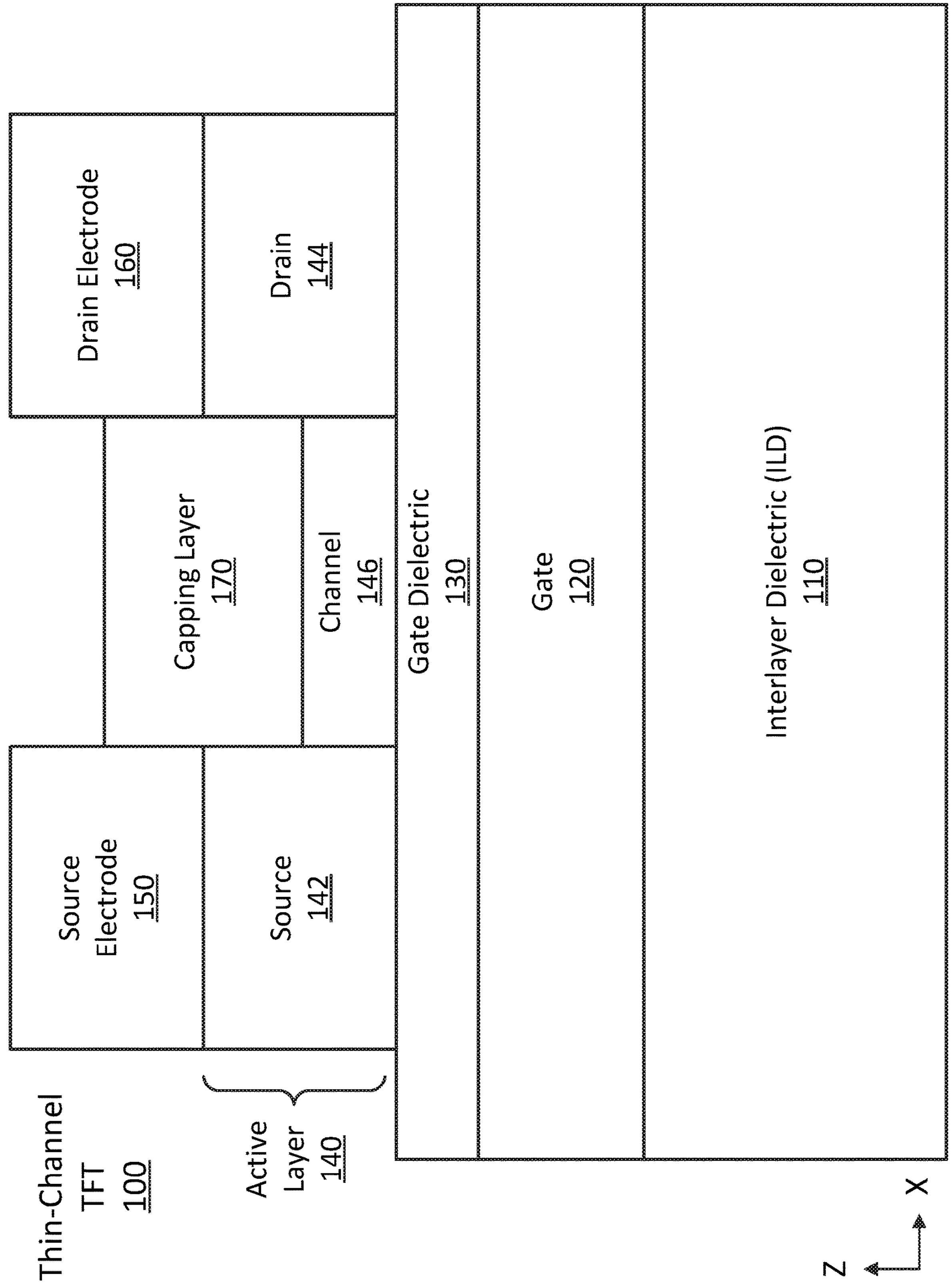
FIG. 1 is a cross-sectional view of an example recessed thin-channel thin-film transistor (TFT), according to an embodiment of the present disclosure.

According to various embodiments of the present disclosure, a recessed thin-channel thin-film transistor (TFT) is provided. The recessed thin-channel TFT may be formed by recessing the back-channel of the TFT. This can improve electrostatics and short-channel control while reducing or eliminating the need for targeting of contact etches, such as source and drain contact etches. In addition, the recession can be performed after source and drain electrode formation, which can allow for a self-aligned process. In some embodiments, the channel region is thinner (e.g., has less vertical thickness) than the source and drain regions. For example, in some embodiments, the channel region is recessed more than the source or drain regions (for example, to provide better gate control and improve any short-channel effects). In some embodiments, the recessed thin-channel region in the TFT provides for longer effective channel length $L_{eff}$ as well as better threshold voltage $V_t$ roll-off and subthreshold swing (SS) roll-off. Such recessed thin-channel TFTs can be useful in memory applications, such as dynamic random-access memory (DRAM), and as backend TFTs in back end of line (BEOL) devices such as embedded DRAM (eDRAM).

General Overview

As noted above, there are a number of non-trivial performance issues associated with thin-film transistors (TFTs). For instance, TFTs with thick bodies do not have good electrostatic gate control. Such devices can suffer from subthreshold swing (SS) degradation and lead to high-voltage devices. Moreover, depositing thin TFT channel materials can make damascene contact etch very challenging due to the aggressive etch chemistry involved. For example, if the layers (e.g., semiconductor or active layers) are too thin, they can be blown through during subsequent processing such as chemical mechanical planarization (CMP), which can have little to no selectivity and can inadvertently remove extra channel material, compromising the TFTs. In general, thicker semiconductor (active) layers (bodies) in TFTs lead to poorer gate control, performance, and voltage levels. While thick bodies may be needed in TFTs (e.g., for copper interconnect processes such as damascene and chemical mechanical planarization), thinning the channel region (such as the back-channel) with respect to the source and drain regions can reduce or eliminate some or all of the degrading thick-body effects. In addition, often, the back-channel interface in such devices is degraded due to passivation and may benefit from cleaning through thinning.

Accordingly, in various embodiments of the present disclosure, the back-channel of a TFT (such as a bottom gate TFT) is recessed with respect to the neighboring source and drain regions of the semiconductor (active) layer. The recession, for example, can be performed in a self-aligned process after source and drain electrode formation by etching the exposed channel region (e.g., an exposed portion of the channel region) between the source and drain electrodes.

Afterwards, a passivation or capping layer including an electrical insulator material can be formed on the recessed channel region to physically connect and electrically separate the exposed sides of the source and drain regions.

According to various embodiments, the channel thickness after the recession can be, for example, a particular fraction of the source and drain thickness (such as half or less of the source and drain thickness, e.g., one third, one quarter). Here, channel thickness is in the vertical direction (e.g., perpendicular to the substrate of an integrated circuit incorporating the TFT). In some embodiments, the channel thickness after the recession can be an absolute thickness, such as between 5 and 20 nanometers (nm), or between 7 and 15 nm, or some particular thickness such as 10 nm. For example, a 40 nm semiconductor layer can be recessed to 20 nm (e.g., about half the height or thickness of the source and drain regions) in some embodiments, to 14 nm (e.g., about a third of the source and drain thickness) in some other embodiments, and to 10 nm (e.g., about a quarter of the source and drain height) in still some other embodiments. However, since benefits accrue for even small amounts of recession (e.g., less removal of channel region material), in some embodiments, the channel is only thinned to 30 nm (e.g., about three quarters of the source and drain thickness).

In an example embodiment of the present disclosure, a recessed thin-channel thin-film transistor (TFT) includes a gate electrode, a gate dielectric on the gate electrode, an active layer including a semiconductor material on the gate electrode, and a capping layer including an insulator material on the active layer. The active layer includes a source region, a drain region, and a semiconductor region above and in direct contact with the gate dielectric and physically connecting the source and drain regions (e.g., as separate structures, as separate regions of the same structure, as separate regions of the same layer, or the like). For instance, each of the source and drain regions can be adjacent to (e.g., physically part of or connecting) a different portion (e.g., a different end or side) of the semiconductor region. The semiconductor region is thinner than the source and drain regions. The capping layer is on the semiconductor region, and physically connects as well as electrically separates the source and drain regions. In an embodiment, the TFT further includes source and drain electrodes electrically connected to the source and drain regions, respectively, with the capping layer physically connecting and electrically separating the source and drain electrodes.

In one or more embodiments, a memory cell includes this TFT, with the gate electrode being electrically connected to a wordline and the source region being electrically connected to a bitline. The memory cell further includes a capacitor including a first terminal electrically connected to the drain region, a second terminal, and a dielectric medium electrically separating the first and second terminals. In some embodiments, a memory array includes a plurality of wordlines extending in a first direction, a plurality of bitlines extending in a second direction crossing the first direction, and a plurality of such memory cells at crossing regions of the wordlines and the bitlines. In some embodiments, the memory array is an embedded memory, e.g., formed in the BEOL process above and electrically connected to frontend or front-end-of-line (FEOL) circuits including memory control circuits such as wordline drivers (electrically connected to the wordlines) and sense amplifiers (electrically connected to the bitlines). In this fashion, the BEOL circuits (memory array) can overlay the FEOL circuits (memory control) and save integrated circuit planar area. As such, embodiments of the present disclosure can be applied to smaller process technologies, such as 14 nanometer (nm), 10 nm, 7 nm, 5 nm, and beyond.

Architecture and Methodology

FIG. 1 is a cross-sectional (X-Z) view of an example recessed thin-channel thin-film transistor (TFT) 100, according to an embodiment of the present disclosure. Throughout, the z-axis represents a vertical dimension (e.g., perpendicular to an integrated circuit substrate), while the x- and y-axes represent horizontal dimensions (e.g., parallel to the wordline and bitline directions, respectively). The components of TFT 100 can be fabricated using semiconductor fabrication techniques, such as deposition and photolithography. The components of TFT 100 can be part of a backend process, such as the back end of line (BEOL) process of a semiconductor integrated circuit. As such, the components of TFT 100 can be fabricated as part of, or concurrently with, the metal interconnection layers (such as the upper or middle metal interconnection layers) of a semiconductor fabrication process. In some other embodiment, the components of TFT 100 are fabricated as part of a front end of line (FEOL) process (e.g., on a substrate instead of the ILD 110).

In example embodiments, fabrication of the components of TFT 100 can be part of the metal 4 (interconnect) layer of a BEOL process, using mostly a custom process (e.g., separate from the other metal 4 features) to form the components. Referring to FIG. 1, a gate (or gate electrode) 120 is formed, such as on an interlayer dielectric (ILD, such as an etch stop material) 110. The gate 120 is conductive, and can represent one or more layers or features for supplying a gate signal to the TFT 100. For instance, the gate 120 can include a wordline (such as a wordline made of copper (Cu) or aluminum (Al)) to supply a gate signal from a wordline driver, along with diffusion barriers and a metal gate electrode for supplying the gate signal to the proximity of the channel region 146 of the TFT 100.

For example, the gate 120 can include thin-film layers such as one or more gate electrode layers (e.g., diffusion barrier and metal gate layers). The diffusion barrier can be a metal- or copper-diffusion barrier (e.g., a conductive material to reduce or prevent the diffusion of metal or copper from a wordline into the metal gate 120 while still maintaining an electrical connection between the wordline and the metal gate 120) on the wordline such as tantalum nitride (TaN), tantalum (Ta), titanium zirconium nitride (e.g., $Ti_XZr_{1-X}N$, such as X=0.53), titanium nitride (e.g., TiN), titanium tungsten (TiW), combination (such as a stack structure of TaN on Ta), or the like.

For instance, the diffusion barrier can include a single- or multi-layer structure including a compound of tantalum (Ta) and nitrogen (N), such as TaN or a layer of TaN on a layer of Ta. In some embodiments, a layer of etch-resistant material (e.g., etch stop) such as silicon nitride (e.g., $Si_3N_4$) or silicon carbide (e.g., SiC) is formed over the wordline with vias for a metal (or copper) diffusion barrier film such as TaN or a TaN/Ta stack. The metal gate can be a conductive material on the diffusion barrier, such as metal, conductive metal oxide or nitride, or the like. For example, in one embodiment, the metal gate is titanium nitride (TiN). In another embodiment, the metal gate is tungsten (W).

The gate 120 is covered with a gate dielectric 130 corresponding to an active (semiconductor) layer 140 (or to a channel area 146 of the active layer) of the TFT 100. The gate dielectric 130 can be a high-κ dielectric material such as hafnium dioxide ($HfO_2$). The gate dielectric 130 can be thin, such as 4 nanometers (nm). In some embodiments, the gate dielectric 130 is in a range of 3 nm to 7 nm. In some embodiments, the gate dielectric 130 is in a range of 2 nm to 10 nm. In some embodiments, the gate dielectric 130 can be silicon dioxide ($SiO_2$), silicon nitride (e.g., $Si_3N_4$), hafnium dioxide ($HfO_2$) or other high-κ material, or a multi-layer stack including a first layer of $SiO_2$ and a second layer of a high-κ dielectric such as $HfO_2$ on the $SiO_2$. Any number of gate dielectrics can be used, as will be appreciated in light of the present disclosure. For example, in one embodiment, the gate dielectric 130 is a layer of $SiO_2$. In another embodiment, the gate dielectric 130 is a stack (e.g., two or more layers) of $HfO_2$ on $SiO_2$.

The semiconductive active layer 140 is formed over the gate dielectric 130. The active layer 140 can be formed in a backend process, for example, from one or more of indium gallium zinc oxide (IGZO), indium zinc oxide (IZO), amorphous silicon (a-Si), low-temperature polycrystalline silicon (LTPS), and amorphous germanium (a-Ge). For example, the active layer 140 can be IGZO or the like in contact with a bitline (such as at a source region 142 of the active layer 140) and a storage node (e.g., at a drain region 144 of the active layer 140), with a semi-conductive channel region 146 between and physically connecting the drain region 144 and the source region 142. Such an active layer channel 146 may include only majority carriers in the thin film. Accordingly, the active layer channel 146 may require high bias (as supplied by the wordline, diffusion barrier film, and metal gate) to activate.

In various embodiments of the present disclosure, the channel region 146 in the recessed thin-channel TFT 100 is recessed (e.g., etched) with respect to the source and drain regions 142 and 144. For example, an active layer 140 can be formed as a semiconductor layer, the source and drain regions 142 and 144 of the semiconductor layer appropriately doped, and the channel region 146 thinned (e.g., to half or less of the thickness of the source and drain regions 142 and 144). In some embodiments, source and drain electrodes 150 and 160 are formed above and electrically connected to the source and drain regions 142 and 144, respectively (e.g., through contact etching), and then the channel region 146 is thinned through etching using the source and drain electrodes 150 and 160 to self-align the process.

The source and drain electrodes 150 and 160 can be formed by, for example, contact etching the source and drain regions 142 and 144, respectively. In some embodiments, a contact metal is annealed, etched, or otherwise formed on or combined with the tops of the source and drain regions 142 and 144 to make contacts, such as silicide (or other appropriate compound, depending on the contact metal) contacts with the active layer 140 material. Example contact metals include titanium nitride (e.g., TiN, $TiN_x$ with $0.6 \le x \le 1.2$), copper (Cu), tungsten (W), titanium oxynitride (e.g., $TiO_xN_y$ with $x>0$ and $y>0$), titanium (Ti), tantalum (Ta), tantalum nitride (e.g., TaN), aluminum titanium nitride (e.g., $AlTi_xN_y$ with $0<x<1$ and $y>0$), tantalum titanium nitride (e.g., $TaTi_xN_y$ with $x>0$ and $y>0$), aluminum tantalum nitride (e.g., $AlTa_xN_y$ with $x>0$ and $y>0$), tungsten nitride (e.g., $W_2N$, WN, $WN_2$), indium arsenide (e.g., InAs), and indium oxide (e.g., $In_2O_3$, $InO_x$ with $x>0$), to name a few. The source and drain electrodes 150 and 160 can then be formed on the contacts.

In addition to IGZO, in some embodiments, the active layer 140 is one of a variety of polycrystalline semiconductors, including, for example, zinc oxynitride (ZnON, such as a composite of zinc oxide (ZnO) and zinc nitride ($Zn_3N_2$), or of ZnO, $ZnO_xN_y$, and $Zn_3N_2$), indium tin oxide (ITO), tin oxide (e.g., SnO), copper oxide (e.g., $Cu_2O$), polycrystalline germanium (poly-Ge) silicon-germanium (e.g., SiGe, such as $Si_{1-x}Ge_x$) structures (such as a stack of poly-Ge over SiGe), and the like. In some embodiments, the active layer 140 is formed from first type channel material, which may be an n-type channel material or a p-type channel material. An n-type channel material may include one or more of indium tin oxide (ITO), indium gallium zinc oxide (IGZO), indium zinc oxide (IZO), aluminum-doped zinc oxide (AZO), amorphous silicon, zinc oxide, amorphous germanium, polysilicon, poly germanium, and poly-III-V like indium arsenide (e.g., InAs). On the other hand, a p-type channel material may include one or more of amorphous silicon (a-Si), zinc oxide (e.g., ZnO), amorphous germanium (a-Ge), polysilicon (polycrystalline silicon or poly-Si), poly germanium (polycrystalline germanium or poly-Ge), poly-like InAs, copper oxide (CuO), and tin oxide (SnO). In some embodiments, the channel region 146 can have a thickness in a range of about 5 nm to about 50 nm.

As mentioned, the active layer 140 can be divided into three different regions, namely the source and drain regions 142 and 144 with the channel region 146 between and physically connecting the source and drain regions 142 and 144. The active layer 140 forms a transistor device with the gate 120 and gate dielectric 130. When a gate signal is supplied to the gate 120, the active layer 140 becomes conductive, and current flows between the source and drain regions 142 and 144 via the channel region 146.

Above the channel region 146, a capping layer (or passivation layer) 170 is formed, between the source and drain regions 142 and 144, and between the source and drain electrodes 150 and 160. The capping layer 170 includes an insulator material, and forms a good interface with the active layer 140 materials, preventing leakage and being hermetic to other metal layers or features. In some embodiments, the capping layer 170 physically connects and electrically separates the source and drain regions 142 and 144 as well as the source and drain electrodes 150 and 160. In some embodiments, the capping layer 170 includes an insulator material, such as aluminum oxide (e.g., $Al_2O_3$), gallium oxide (e.g., $Ga_2O_3$), silicon nitride (e.g., $Si_3N_4$, SiN), silicon dioxide ($SiO_2$), titanium dioxide ($TiO_2$), hafnium dioxide ($HfO_2$), silicon oxynitride (e.g., $Si_2N_2O$, $SiO_xN_y$ with $0 \le x \le 2$ and $0 \le y \le 4/3$), aluminum silicate (e.g., $Al_2O_3(SiO_2)_x$ with $x>0$), tantalum oxide (e.g., $Ta_2O_5$), hafnium tantalum oxide (e.g., $HfTa_xO_y$ with $x>0$ and $y>2$), aluminum nitride (e.g., AlN), aluminum silicon nitride (e.g., $AlSi_xN_y$ with $x>0$ and $y>1$), sialon (e.g., $AlSi_xO_yN_z$ with $x>0$, $y>0$, and $z>0$), zirconium dioxide ($ZrO_2$), hafnium zirconium oxide (e.g., $HfZr_xO_y$ with $x>0$ and $y>2$), tantalum silicate (e.g., $TaSi_xO_y$ with $x>0$ and $y>0$), hafnium silicate (e.g., $HfSiO_4$, $HfSi_xO_y$ with $x>0$ and $y>2$), or the like.

For instance, in some embodiments, the capping layer includes one or more of aluminum oxide, silicon nitride, titanium dioxide, hafnium dioxide, silicon oxynitride, and aluminum nitride. The source electrode 150 is formed and electrically connected to the source region 142 and the drain electrode 160 is formed and electrically connected to the drain region 144. The source and drain electrodes 150 and 160 can be metal, such as metal interconnect layer material (e.g., Cu, Al, or tungsten (W)). The thin-channel TFT 100 acts as a switch, electrically connecting the source and drain electrodes 150 and 160 in response to a gate signal, such as a gate signal being supplied to the gate 120.

Figure 2:
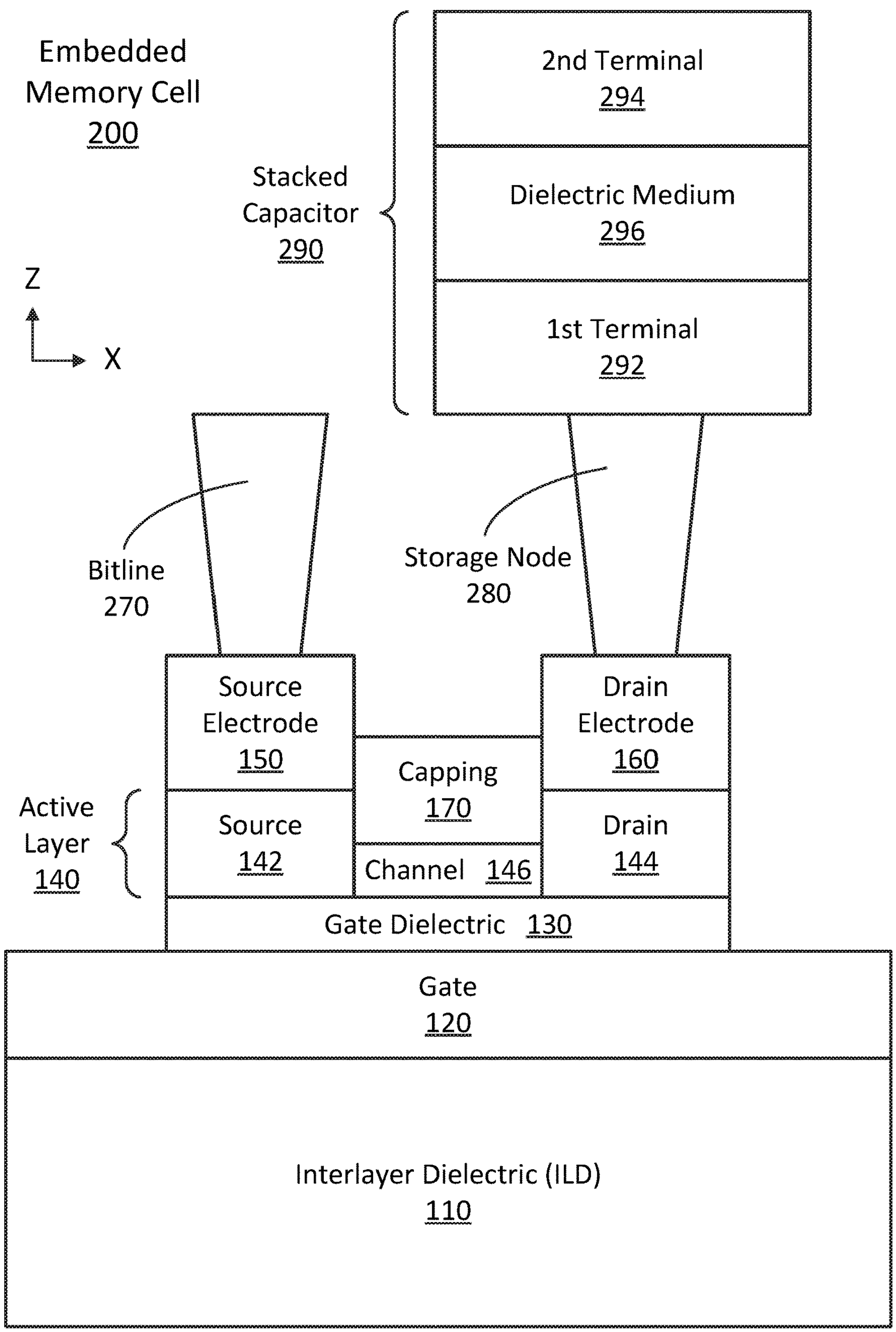
FIG. 2 is a cross-sectional view of an example embedded memory cell having a stacked capacitor with a recessed thin-channel TFT, according to an embodiment of the present disclosure.

FIG. 2 is a cross-sectional (X-Z) view of an example embedded memory cell 200 having a stacked capacitor 290 with a recessed thin-channel TFT (such as the recessed thin-channel TFT 100 of FIG. 1), according to an embodiment of the present disclosure. In FIG. 2, a metal bitline 270 (e.g., metal interconnect material, such as copper, aluminum, or tungsten) is formed on the source electrode 150. The bitline 270 is used, for example, to program or sense the capacitance of the capacitor 290 through the source region 142 of the recessed thin-channel TFT 100 when the TFT 100 is turned on. In addition, a storage node 280 (e.g., further metal interconnect material) is formed on the drain electrode 160. The storage node 280 electrically connects the drain electrode 160 to the capacitor 290 to write (e.g., program) or read (e.g., sense) the capacitance (e.g., logical 1 or 0) of the capacitor 290 (e.g., through the bitline 270 when the thin-channel TFT 100 is turned on).

In some embodiments, the bitline 270 is used in combination with the storage node 280 to program or sense the state of a capacitor when the thin-channel TFT 100 is used as part of a memory device (such as a DRAM cell). In some other embodiments, the thin-channel TFT 100 acts as a switch, controlling an electrical current between the storage node 280 and bitline 270. In some embodiments, the roles of the source and drain electrodes 150 and 160 are reversed, the drain electrode 160 being connected to the bitline 270 and the source electrode 150 being connected to the storage node 280.

The stacked capacitor 290 is formed in layers (e.g., as part of a BEOL process, such as part of the metal 6 interconnect layer). The capacitor 290 includes a first terminal 292, a dielectric (or dielectric medium) 296 on the first terminal 292, and a second terminal 294 on the on the dielectric 296. The first and second terminals 292 and 294 can be metals or other conductive materials (e.g., metal, conductive metal nitride or carbide, or the like), while the dielectric 296 can be an insulator to electrically separate the first and second terminals 292 and 294, allowing a capacitance to be formed between the first and second terminals 292 and 294. The first terminal 292 is electrically connected to the drain electrode 160 via the storage node 280. The second terminal 294 can be electrically connected, for example, to a common or programmable voltage (such as a ground voltage), or to a plate line (e.g., to all the memory cells 200 sharing the same wordline driving the gate 120) for supplying a common or programmable voltage.

In further detail, in one embodiment, the first terminal 292 is tantalum (Ta). In another embodiment, the first terminal 292 is titanium nitride (TiN). In some embodiments, the first terminal 292 is titanium aluminum nitride (e.g., TiAlN, where the molar amount of titanium is at least that of aluminum). In another embodiment, the first terminal 292 is tantalum aluminum carbide (TaAlC). In another embodiment, the first terminal 292 is tantalum nitride (TaN). For example, in one embodiment, the second terminal 292 is TiN. For example, in one embodiment, the dielectric 296 is $SiO_2$. In some embodiments, such as to reduce tunneling (e.g., when the dielectric 296 is very thin), the dielectric 296 is a high-κ dielectric material such as zirconium dioxide ($ZrO_2$) or aluminum oxide ($Al_2O_3$).

The first terminal 292 of the capacitor 290 connects to a corresponding storage node 280 through the storage node 280. The first terminals 292 of multiple such capacitors 290 (e.g., belonging to memory cells coupled to the same wordline) are electrically insulated from each other while the second terminal 294 of the capacitors 290 are electrically connected to each other through a (shared) capacitor plate or plate line at the top of the capacitors 290 (e.g., located in the via portion of the metal 7 interconnect layer). There may be separate capacitor plates for separate arrays of capacitors 290 (e.g., one for each wordline). The capacitor plates may be coupled to a common voltage line (for example, in the interconnect portion of the metal 7 layer) to supply a common voltage to all the second terminals 294 through the capacitor plate.

The source contact of the TFT 100 is continuous and is used as the bitline 270 of the memory cell 200. The heights of the source and drain contacts can be optimized to reduce bitline capacitance (e.g., between the source and drain contacts) for better sensing margins. The source contacts of the TFTs 100 also serve as the bitlines of an embedded memory array. The dimensions of the source contacts (bitlines 270) can be customized for lower inter-metal capacitance (e.g., by using a separate fabrication stage to form the bitlines 270 versus the fabrication stage for this metal level in areas of the integrated circuit outside of the memory array). Each capacitor 290 connects to a drain contact (e.g., storage node 280) of the TFT 100.

Figure 3:
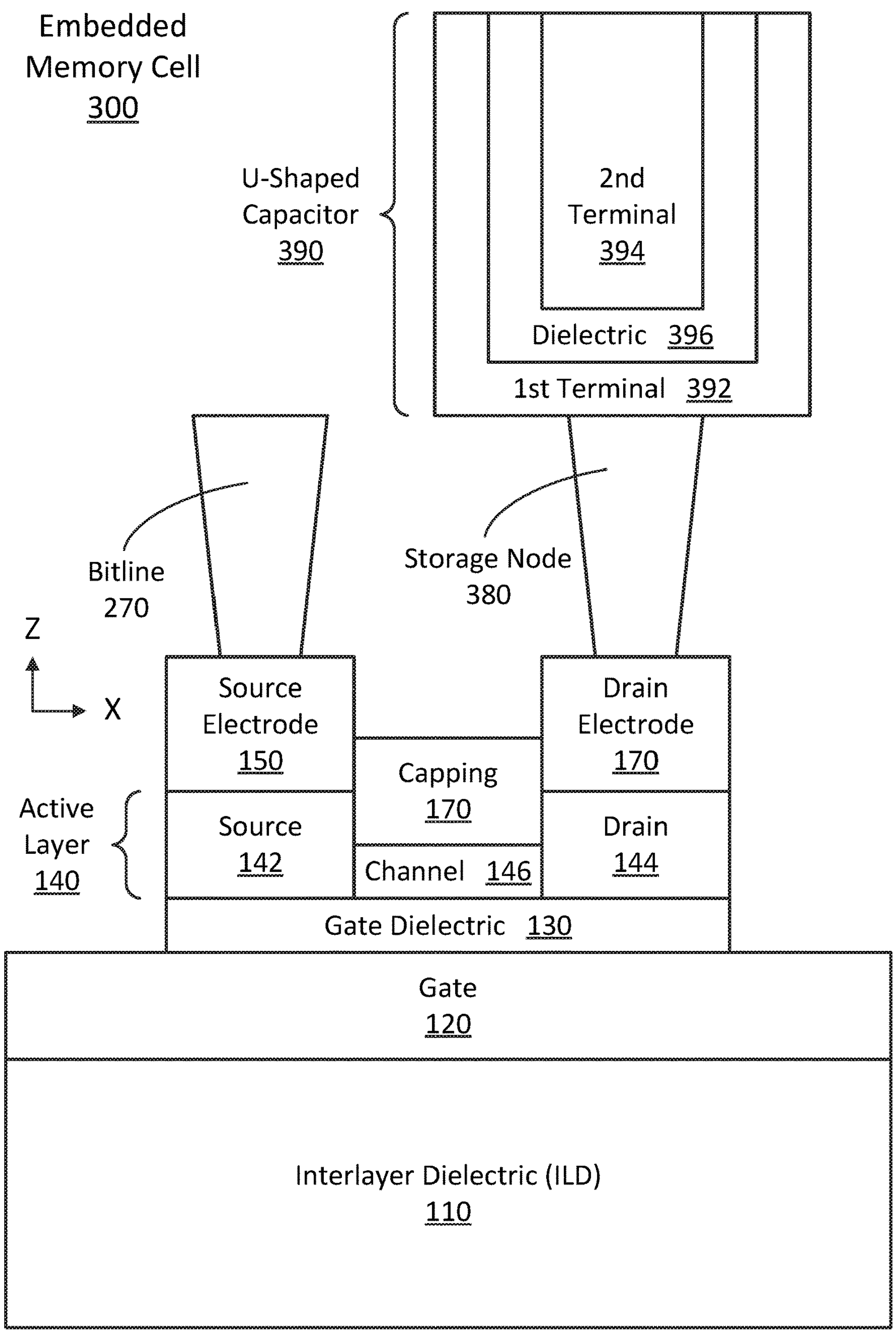
FIG. 3 is a cross-sectional view of an example embedded memory cell having a U-shaped capacitor with a recessed thin-channel TFT, according to an embodiment of the present disclosure.

FIG. 3 is a cross-sectional (X-Z) view of an example embedded memory cell 300 having a U-shaped capacitor 390 with a recessed thin-channel TFT (such as the recessed thin-channel TFT 100 of FIG. 1), according to an embodiment of the present disclosure. Here, the embedded memory cell 300 has a similar structure to that of the embedded memory cell 200 in FIG. 2, but the capacitor 390 has a U-shaped structure, with first and second terminals 392 and 394, and a U-shaped dielectric 396. The U-shape can take advantage of the thicker metal interconnection layers to etch a relatively deep trench to boost capacitive surface area and capacitance without increasing planar area. Some of the components are the same or similar between the embodiments of FIGS. 2-3, and are numbered the same. For ease of discussion, their descriptions may not be repeated. Further, the materials for similarly numbered or named structures can be substantially the same between the two embodiments.

In an array of such embedded memory cells 300, storage nodes 380 (drain contacts) of the TFTs 100 in the memory cells 300 are separated between cells 300. Each storage node 380 is connected to a U-shaped capacitor 390, such as a metal-insulator-metal (MIM) capacitor above. For example, the storage node may be one or more structures electrically connecting the drain electrode 160 to the first terminal 392 through one or more BEOL layers, such as the metal 5 interconnect and metal 6 via portions of the backend processing. The capacitor 390 may be fabricated in the interconnect portion of the metal 6 layer and the via portion of the metal 7 layer.

The capacitor 390 may be fabricated by etching (for example, by photolithography) deep, narrow trenches in the upper portion of the metal 6 layer and the via portion of the metal 7 layer, and lining the trenches with a thin conductor (such as first terminal 392), a thin insulator (such as dielectric 396), and another thin conductor (such as second terminal 394), the thin insulator insulating one thin conductor from the other thin conductor. The capacitor 390 is fabricated in a separate process from the rest of the metal 6 layer and metal 7 layer fabrication (to account for its large height and different electrode material from the rest of the metal 6 layer and metal 7 layer). This creates a relatively large capacitance in the capacitor 390 by having a relatively large surface area for the terminals (e.g., first and second terminals 392 and 394) separated by a relatively small amount of insulation (e.g., dielectric 396).

In further detail, in one or more embodiments of the present disclosure, the capacitor 390 is formed by etching a trench in the metal 6 layer (e.g., interconnect portion) and metal 7 layer (e.g., via portion), and successively filling the trench with the three layers by, for example, atomic level deposition (ALD). For instance, the first terminal 392 can be filled to a thickness of 20-40 nm using a conductive material (e.g., metal, conductive metal nitride or carbide, or the like), followed by a thin dielectric 396 (to increase capacitance, for example, 20-40 nm), followed by a second terminal 394 again, using metal (such as 20-40 nm thick), which can be coupled to the top electrode of every other capacitor 390 (e.g., in an array of eDRAM memory cells). The capacitor 390 can be at least 300 nm in some embodiments (e.g., for metal 5 layers on the order of 140 nm), to provide sufficient capacitance.

For example, in one embodiment, the first terminal 392 is tantalum (Ta). In another embodiment, the first terminal 392 is titanium nitride (TiN). In some embodiments, the first terminal 392 is titanium aluminum nitride (e.g., TiAlN, where the molar amount of titanium is at least that of aluminum). In another embodiment, the first terminal 392 is tantalum aluminum carbide (TaAlC). In another embodiment, the first terminal 392 is tantalum nitride (TaN). For example, in one embodiment, the second terminal 394 is TiN. For example, in one embodiment, the dielectric 396 is $SiO_2$. In some embodiments, such as to reduce tunneling (e.g., when the dielectric 396 is very thin), the dielectric 396 is a high-κ dielectric material such as zirconium dioxide ($ZrO_2$) or aluminum oxide ($Al_2O_3$).

Each first terminal 392 of the capacitor 390 connects to a corresponding storage node 380. The first terminals 392 of the capacitors 390 are electrically insulated from each other while the second terminals 394 of the capacitors 390 are electrically connected to each other through a (shared) capacitor plate at the top of the capacitors 390, e.g., located in the via portion of the metal 7 layer. There may be separate capacitor plates for separate arrays of capacitors 390 (such as a separate capacitor plate for each group of capacitors 390 whose corresponding thin-channel TFTs 100 are coupled to the same wordline). The capacitor plate may be coupled to a common voltage line (for example in the interconnect portion of the metal 7 layer) to supply a common voltage to all of the second terminals 394 through the capacitor plate.

Figure 4:
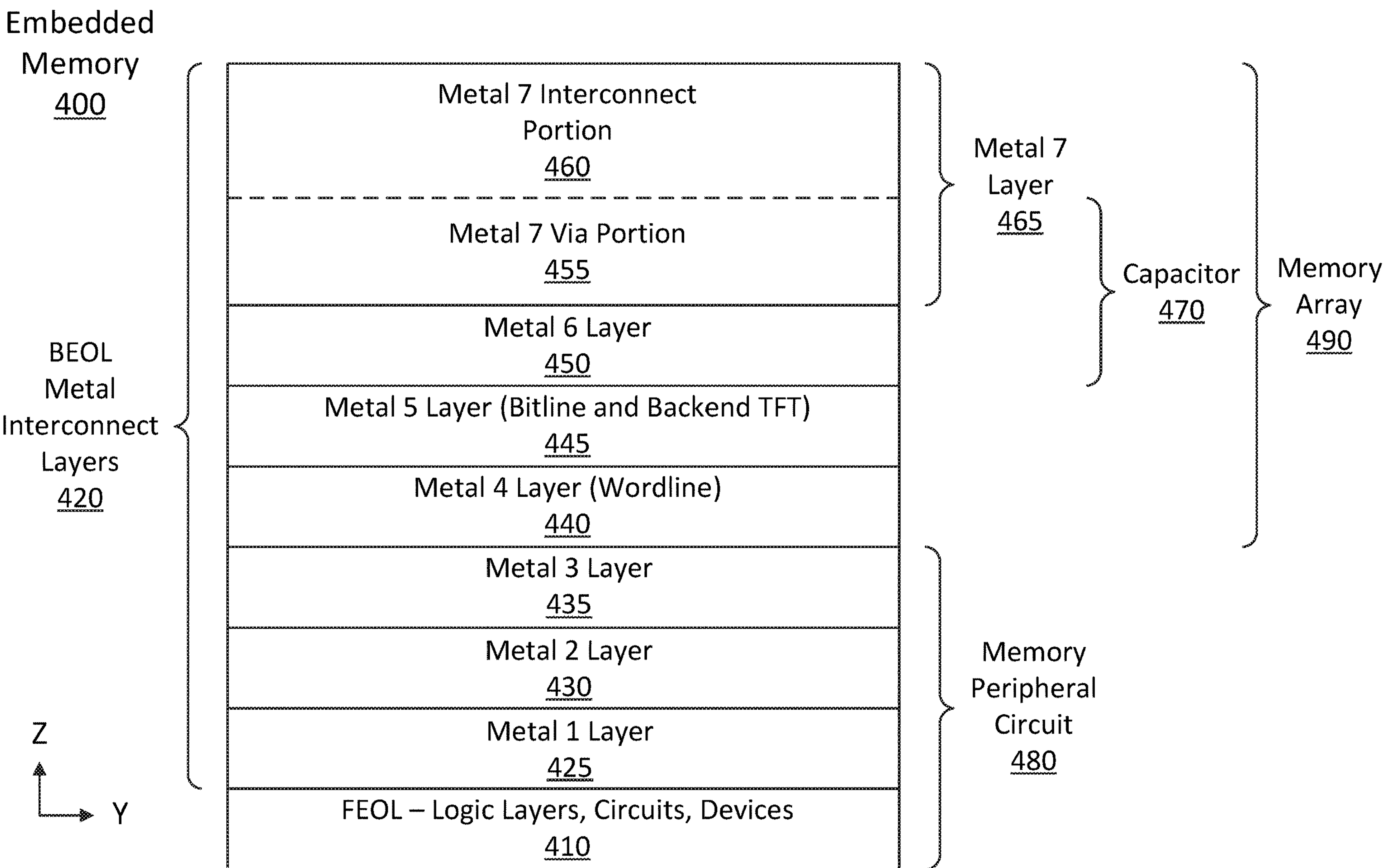
FIG. 4 is a cross-sectional view of an example recessed thin-channel TFT-based embedded memory, according to an embodiment of the present disclosure.

FIG. 4 is a cross-sectional (Y-Z) view of an example recessed thin-channel TFT-based embedded memory 400, according to an embodiment of the present disclosure. FIG. 4 illustrates the Y and Z dimensions (width and height, respectively), the X dimension (length) extending into and out of the Y-Z plane. The embedded memory 400 includes an FEOL 410 that includes most of the various logic layers, circuits, and devices to drive and control the integrated circuit (e.g., chip) being fabricated with the embedded memory 400. As illustrated in FIG. 4, the embedded memory 400 also includes a BEOL 420 including, in this case, seven metal interconnection layers (namely, metal 1 layer 425, metal 2 layer 430, metal 3 layer 435, metal 4 layer 440, metal 5 layer 445, metal 6 layer 450, and metal 7 layer 465, including metal 7 via portion 455 and metal 7 interconnect portion 460) to interconnect the various inputs and outputs of the FEOL 410.

Generally speaking, and specifically illustrated for the metal 7 layer 465, each of the metal 1 layer 425 through the metal 7 layer 465 includes a via portion and an interconnect portion located above the via portion, the interconnect portion being for transferring signals along metal lines extending in the X or Y directions, the via portion being for transferring signals through metal vias extending in the Z direction (such as to the next lower metal layer underneath). Accordingly, vias connect metal structures (e.g., metal lines or vias) from one metal layer to metal structures of the next lower metal layer. Further, each of the metal 1 layer 425 through the metal 7 layer 465 includes a pattern of conductive metal, such as copper (Cu) or aluminum (Al), formed in a dielectric medium or interlayer dielectric (ILD), such as by photolithography.

In addition, the embedded memory 400 is further divided into a memory array 490 (e.g., an eDRAM memory array) built in the metal 4 layer 440 through the metal 7 layer 465 and including the backend TFTs (such as recessed thin-channel TFTs in the metal 5 layer 445) and capacitors 470 (in the metal 6 layer 450 and metal 7 layer via portion 455) as well as the wordlines (e.g., row selectors, in the metal 4 layer 440) and the bitlines (e.g., column selectors, in the metal 5 layer 445) making up the eDRAM memory cells, and a frontend circuit including a memory peripheral circuit 480 built in the FEOL and metal 1 layer 425 through metal 3 layer 435 to control (e.g., access, store, refresh) the memory array 490. The backend TFTs are electrically connected to the frontend circuit.

Compared to other techniques that locate such a memory control circuit in the same layers as the memory array but in a different macro (or X-Y) area of the integrated circuit than the memory array (such as at a periphery of the memory array), the embedded memory 400 locates the memory peripheral circuit 480 below the memory array 490 (e.g., in the same X-Y area). This saves valuable X-Y area in the finished integrated circuit. In further detail, the embedded memory 400 embeds the low-leakage selector TFTs (e.g., backend TFTs including recessed thin-channel TFTs) in the metal 5 layer 445 (such as the via portion of the metal 5 layer 445). For example, the metal 4 layer 440 can contain the wordlines extending in the X direction to select a row of memory cells (bits) while the metal 5 layer 445 can contain the bitlines extending in the Y direction to sense each of the memory cells (bits) in the selected row (and to write memory data to any of the memory cells in the selected row). The backend thin-channel TFTs can be fabricated in the metal 5 layer 445, above the wordlines (that serve as or connect to the gate electrodes or contacts) and below the bitlines (that serve as the source electrodes or contacts). For example, the recessed thin-channel backend TFT can have the transistor gate below the thin-film layer (that can be formed at the bottom of the metal 5 layer 445, such as in the via portion) and source and drain contacts above the thin-film layer.

In further detail, in some embodiments, the metal gate of the TFT in each memory cell can be connected to a continuous metal 4 line below, such as a copper (Cu)-based metal line, which provides much lower resistance compared to gate lines formed in the lower (e.g., FEOL) portions of the integrated circuit. The continuous metal 4 line is used as the wordline of the memory array, and is covered by diffusion barriers or diffusion barrier layers including dielectric layers, such as silicon nitride (e.g., $Si_3N_4$), silicon carbide (e.g., SiC), or the like, with vias filled with metal-diffusion barrier films like tantalum nitride (TaN), tantalum (Ta), titanium zirconium nitride (e.g., $Ti_xZr_{1-X}N$, such as X=0.53), titanium nitride (e.g., TiN), titanium tungsten (TiW), or the like. A metal gate layer covers the diffusion barrier film-filled vias, which electrically connect the copper (Cu) wordline to the metal gates of the selector TFTs, the diffusion barrier film preventing or helping to prevent the diffusion or migration of copper (Cu) from the wordline to the rest of the selector TFTs. The metal 5 layer 445 can include an active thin-film layer (e.g., indium gallium zinc oxide, or IGZO) and then source and drain contacts above the thin-film layer. The space between the source and drain contacts determines the gate length of the selector transistor. A three-dimensional capacitor 470 is embedded in the metal 6 layer 450 and via portion 455 of the metal 7 layer 465 (below the metal 7 interconnect portion 460).

Figure 5:
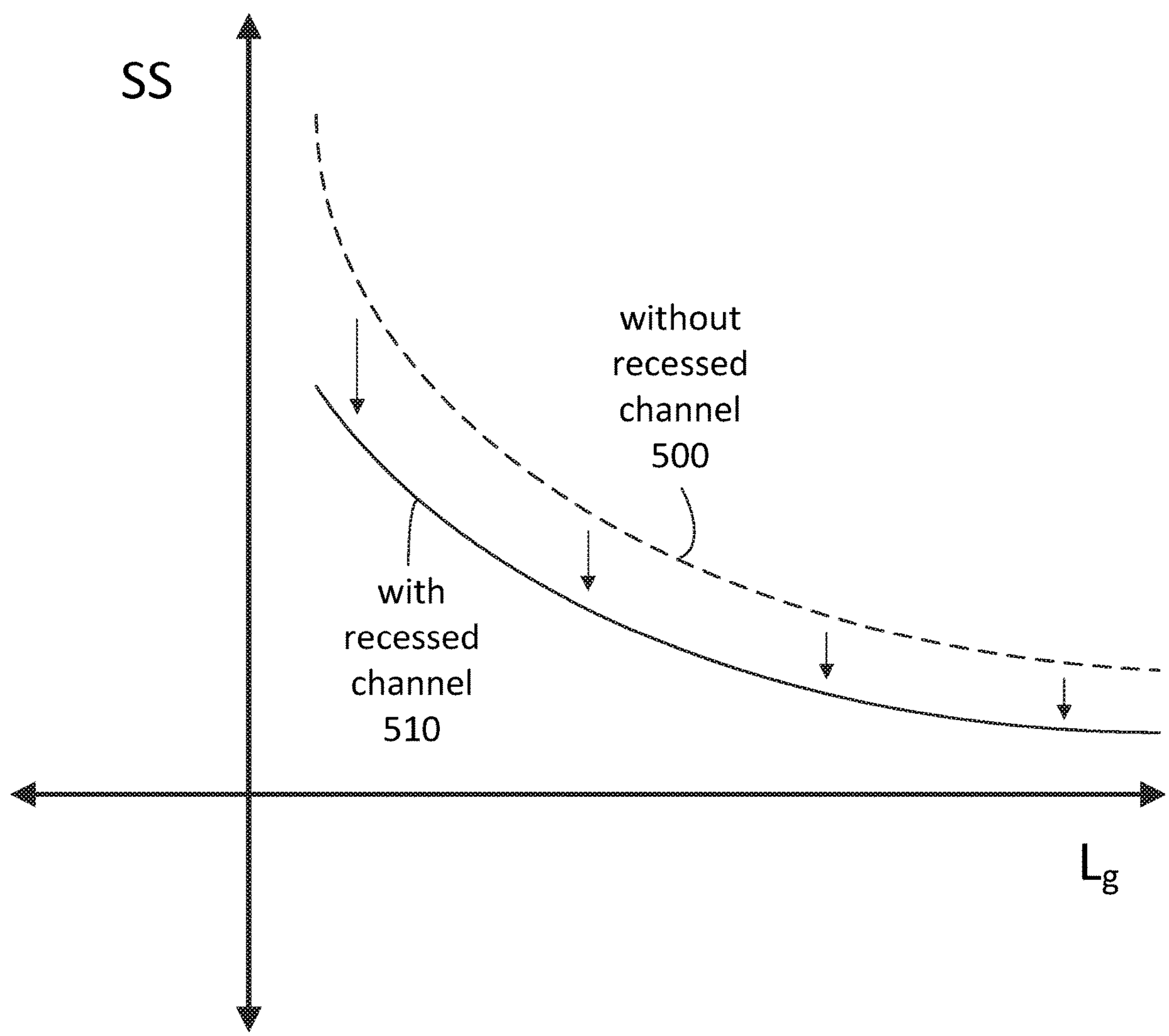
FIG. 5 is an example gate length-subthreshold swing (SS) curve and comparison curve for driving a recessed thin-channel TFT, according to an embodiment of the present disclosure.

FIG. 5 is an example gate length-subthreshold swing (SS) curve 510 and comparison curve 500 for driving a recessed thin-channel TFT, according to an embodiment of the present disclosure. The curve 510 is representative of an embodiment of the present disclosure, the TFT having a recessed thin-channel region as described above (such as a TFT whose channel height is half that of the source and drain heights in the active layer, e.g., 20 nm when the source and drain region height is 40 nm). The curve 500 is for a similar configuration, only no recession of the channel region is present (e.g., the channel region is the same height as the source and drain regions in the semiconductor active layer). The x-axis of FIG. 5 tracks the gate length $L_g$ of the TFT (increasing to the right, with 0 gate length being at the intersection with the y-axis), while the y-axis tracks the subthreshold swing (SS). SS is the ratio of the gate voltage $V_{gs}$ to the base 10 logarithm of the corresponding drain-to-source current $I_{DS}$ corresponding to the gate voltage $V_{gs}$. Here, the gate voltage $V_{gs}$ is held constant at a gate-on voltage to keep the transistor turned on (e.g., at or near maximum current), while the drain-to-source current $I_{DS}$ varies with the gate length $L_g$. The resulting SS is illustrated in the y-axis of FIG. 5, decreasing from top to bottom, with the theoretical minimum SS (for the technology) being at the intersection of the x-axis).

As can be seen in FIG. 5, TFT performance degrades with shorter gate length $L_g$ (e.g., due to short-channel effects), but improves with the recessed channel. Put another way, a recessed channel can improve performance of TFTs, such as by increasing the electric field of the channel and overcoming a portion of the short-channel effects. This improvement can increase with larger recession of the channel (e.g., thinner channels), such as thin-channels whose height is less than half (e.g., one third or one quarter, such as 15 nm or 10 nm for 40 nm thick source and drain regions) the height of the source and drain regions of the semiconductor (active) layer. However, this improvement only continues for so long. For example, at some point, the thinner channels can lead to device failure (e.g., over-etching the channel region during the recession) or decreased performance (e.g., due to factors such as increased capacitance effects on the channel, decreased mobility of the charge carriers, and increased resistance from the decrease in cross-sectional area, to name a few).

Figure 6A:
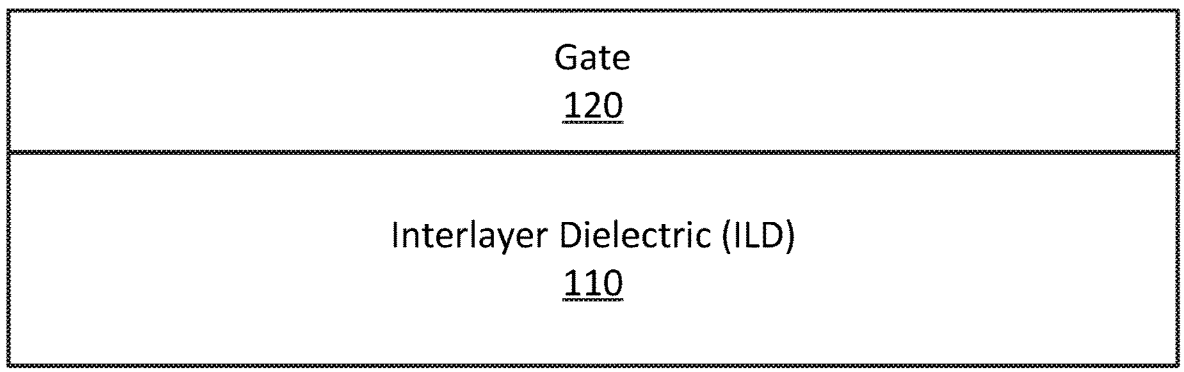
FIGS. 6A-6G are cross-sectional views illustrating an example method of fabricating a recessed thin-channel TFT, according to an embodiment of the present disclosure.
Figure 6B:
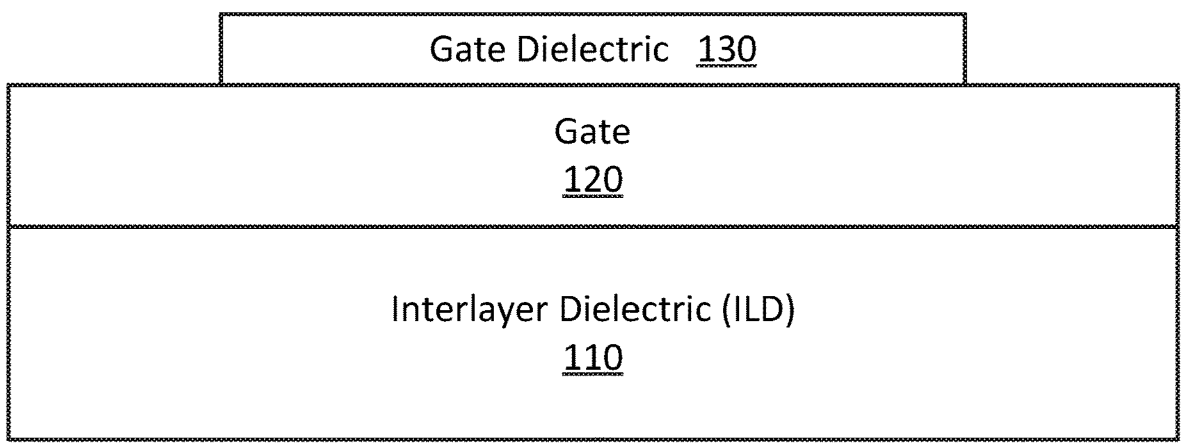
Figure 6C:
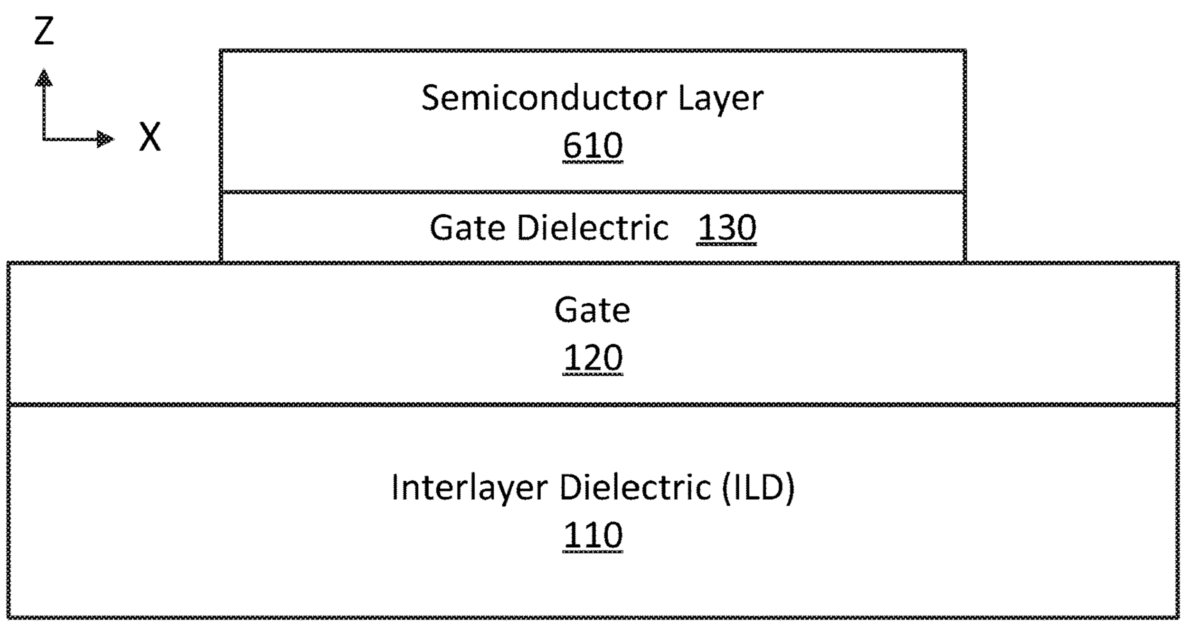

FIGS. 6A-6G are cross-sectional (X-Z) views illustrating an example method of fabricating a recessed thin-channel TFT, according to an embodiment of the present disclosure. The thin-channel TFT can be a backend TFT, such as formed as part of a BEOL process. In FIG. 6A, a gate electrode 120 is formed on an interlayer dielectric (ILD) 110. The gate 120 can include multiple components or layers, such as a wordline, a diffusion barrier layer, a metal gate, and the like. The ILD 110 can include etch stop or other insulating material, such as planarizing material for electrically isolating structures between or within one or more metal interconnect layers in the BEOL process. In FIG. 6A, a gate dielectric 130 is formed on the gate 120. The gate dielectric 130 can be thin, such as 4 nm, but in some embodiments may be between 3 nm and 7 nm, and in some other embodiments may be between 2 nm and 10 nm. The gate dielectric 130 may include a high-κ material such as hafnium dioxide ($HfO_2$). In FIG. 6C, a semiconductor layer 610 is formed on the gate dielectric 130. For example, the semiconductor layer 610 can be 40 nm. In some embodiments, the semiconductor layer 610 is between 30 and 60 nm. In some other embodiments, the semiconductor layer 610 is between 20 nm and 80 nm. Example semiconductor layer 610 materials include indium gallium zinc oxide (IGZO), indium zinc oxide (IZO), amorphous silicon (a-Si), low temperature polycrystalline silicon (LTPS), and amorphous germanium (a-Ge).

Figure 6D:
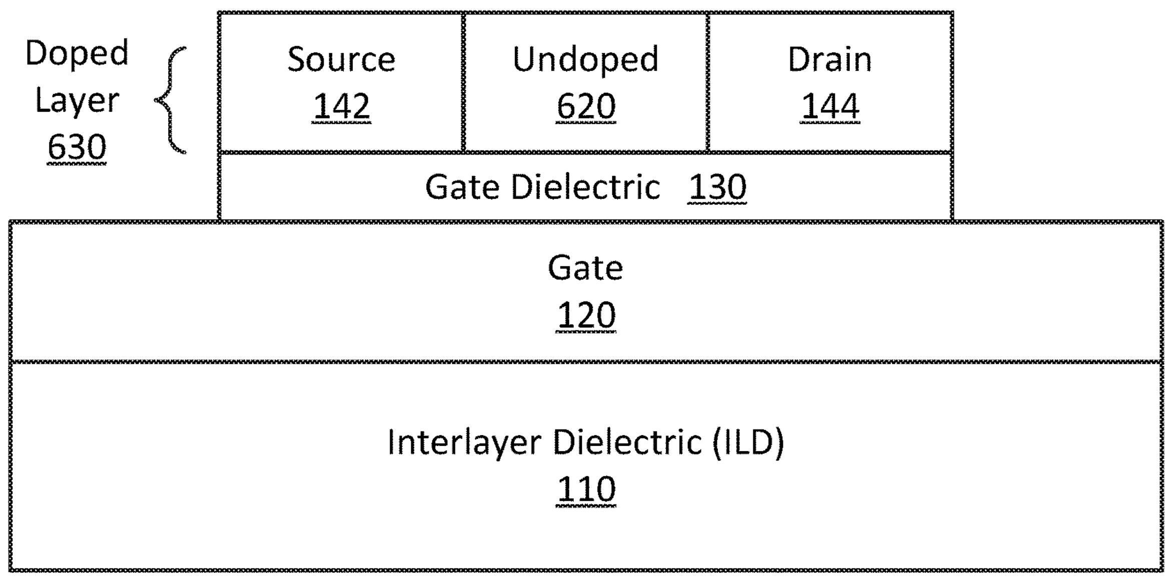
Figure 6E:
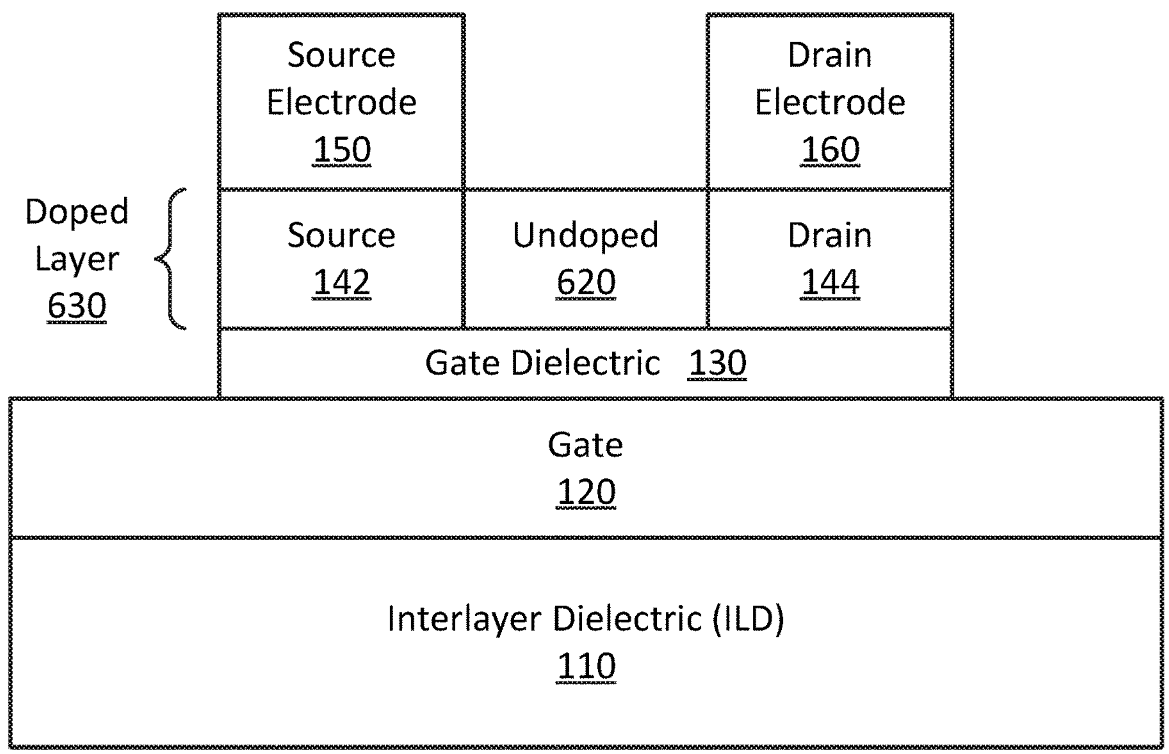

In FIG. 6D, the semiconductor layer 610 is doped. More specifically, end portions of the semiconductor layer 610 are doped to form a doped layer 630 including doped source and drain regions 142 and 144 while leaving undoped region 620. The doping may be sufficient to make source and drain regions 142 and 144 conductive. In FIG. 6E, source and drain electrodes 150 and 160 are formed over the source and drain regions 142 and 144, respectively. The source and drain electrodes 150 and 160 may be metal, such as copper interconnect, formed by a damascene process using chemical mechanical planarization (CMP).

Figure 6F:
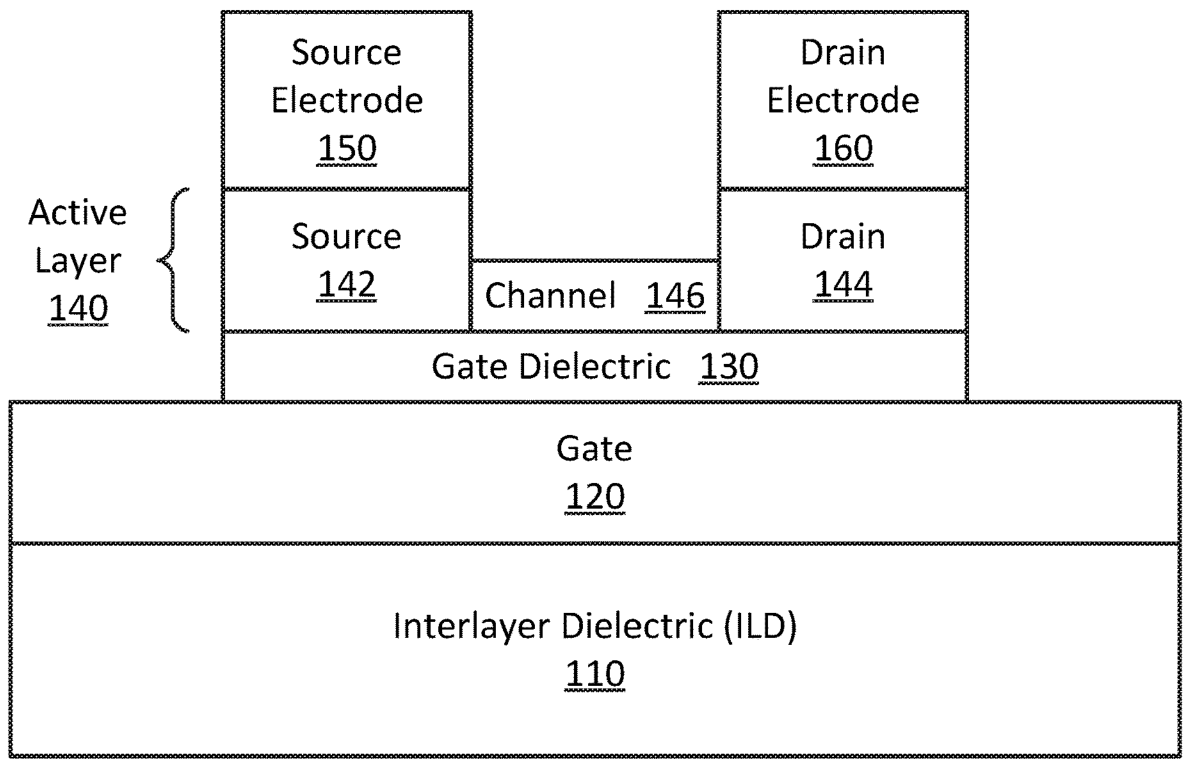
Figure 6G:
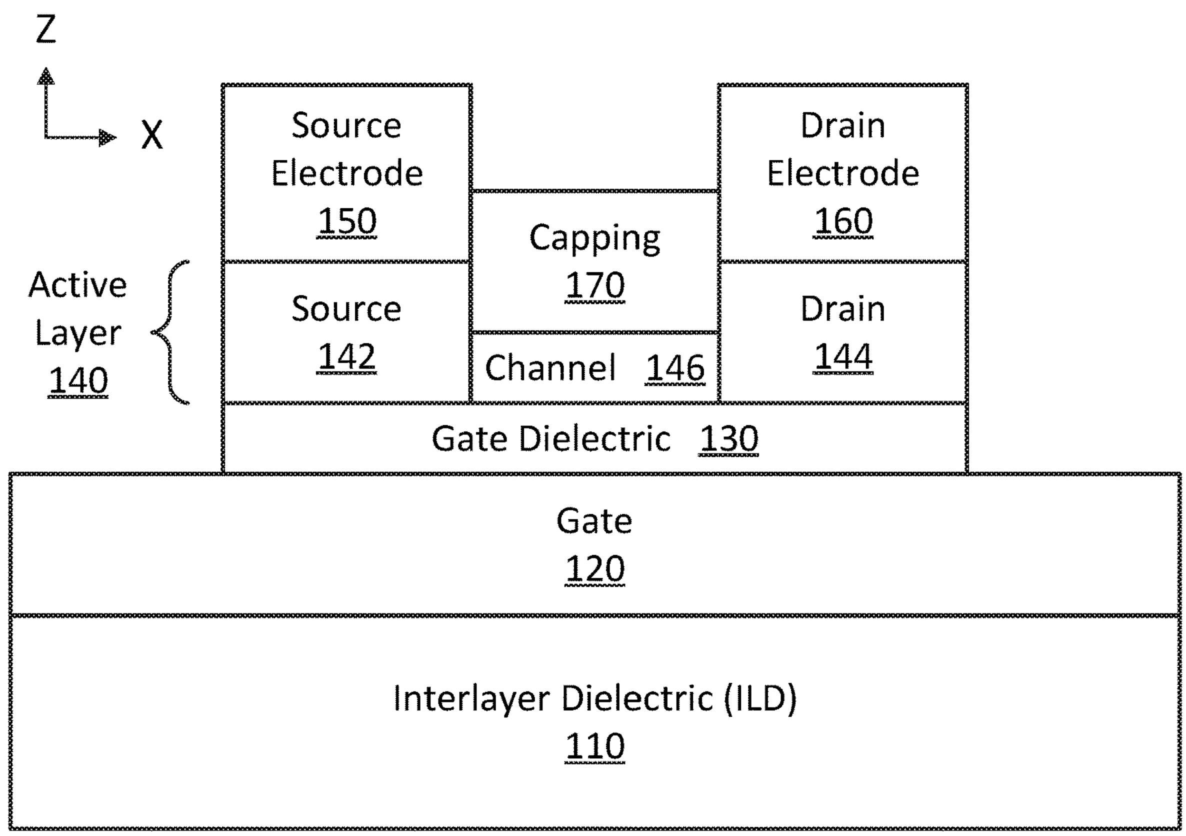

In FIG. 6F, the source and drain electrodes 150 and 160 are used as part of a self-aligned process to recess or thin (e.g., through etching) the undoped region 620 to form the recessed channel region 146 and complete the active layer 140. For example, half or more of the semiconductor material in the undoped region 620 can be removed, leaving a channel region 146 whose height (thickness) is half or less than that of the source and drain regions 142 and 144. In some embodiments, the removal exposes the source and drain regions 142 and 144 over the channel region 146. In some embodiments, the channel region 146 is thinned down to 10 nm in thickness. In other embodiments, the channel region 146 is thinned to somewhere between 7 nm and 15 nm. In still other embodiments, the channel region 146 is thinned to between 5 nm and 20 nm. In FIG. 6G, a capping layer (passivation layer) 170 including an insulator material is formed over the channel region 146.

The capping layer 170 can extend beyond the height of the source and drain regions 142 and 144, partway up the source and drain electrodes 150 and 160, to protect (seal) the channel region 146 and to physically connect and electrically separate the source and drain regions 142 and 144 as well as the source and drain electrodes 150 and 160. In some embodiments, the capping layer 170 can include one or more of aluminum oxide, silicon nitride, titanium dioxide, hafnium dioxide, silicon oxynitride, and aluminum nitride.

Figure 7:
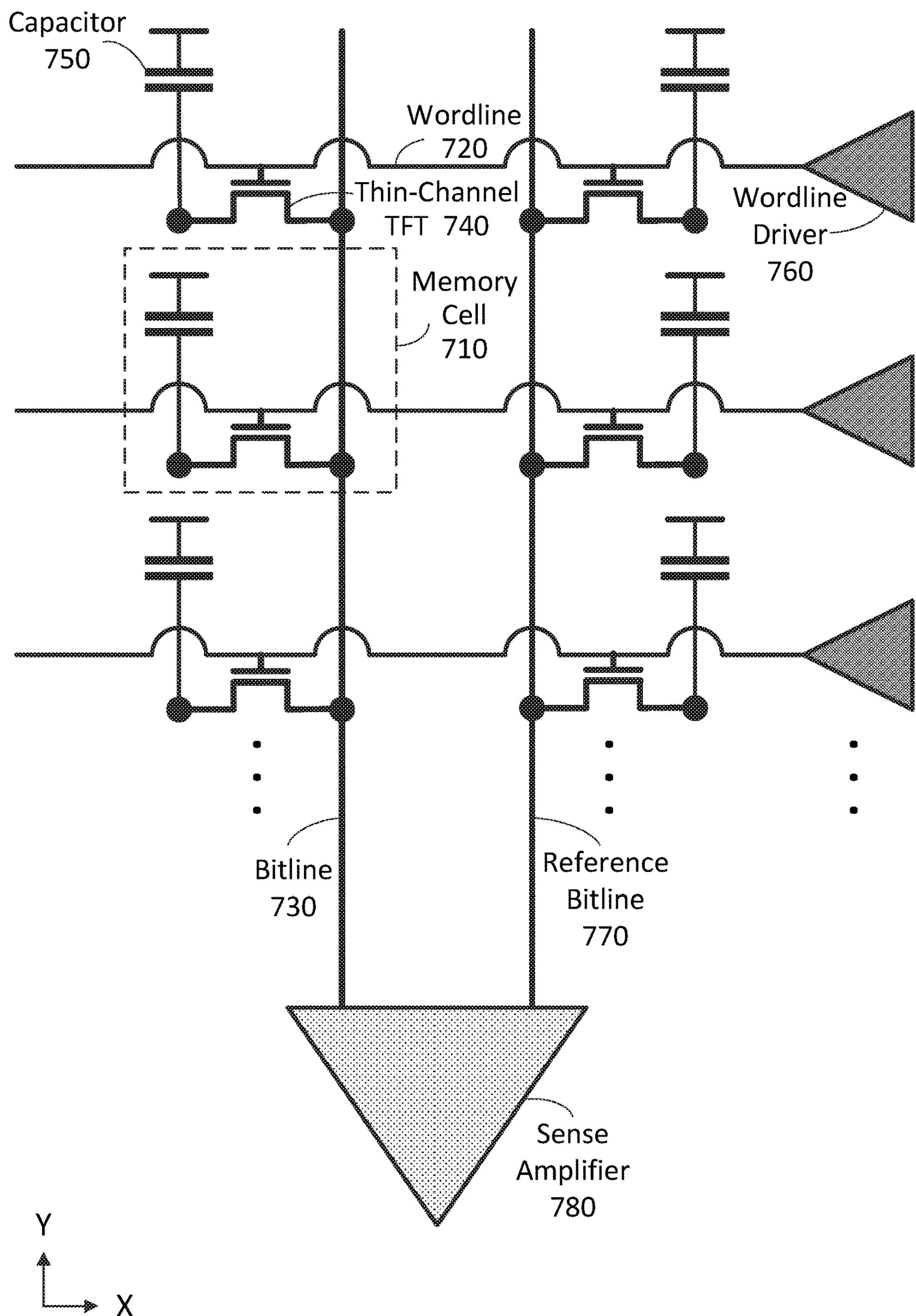
FIG. 7 is a schematic plan view of an example recessed thin-channel TFT-based embedded memory configuration, according to an embodiment of the present disclosure.

FIG. 7 is a schematic plan (X-Y) view of an example recessed thin-channel TFT-based embedded memory configuration, according to an embodiment of the present disclosure. The memory array configuration of FIG. 7 includes memory cells 710 at crossing regions of wordlines 720 and bitlines 730 (e.g., each memory cell 710 being driven by a unique pair of wordline 720 and bitline 730), each memory cell 710 including a recessed thin-channel TFT 740 and a capacitor 750. Each wordline 720 is selected by a corresponding wordline driver 760, while the corresponding bitlines 730 are used to sense the state of the capacitor 750 (e.g., logical 1 or 0) of each of the corresponding bits of the selected wordline 720. In some embodiments, a reference column of memory cells provides a corresponding reference signal (e.g., halfway between a logic low value and a logic high value) over a reference bitline 770 concurrently with the sensing of the desired bit on the bitline 730. These two values are compared, by a sense amplifier 780, which determines whether the desired bit is a logic high value (e.g., 1) or a logic low value (e.g., 0).

The memory cells 710 are embedded in BEOL layers (such as the higher metal interconnect layers of the BEOL) while the peripheral circuits responsible for memory operation, including the read sense amplifiers 780 (and other bitline driver circuits) and wordline driver circuits 760, are placed below the memory array (e.g., in the FEOL and lower metal interconnect layers of the BEOL) to reduce area of the embedded memory.

Figure 8C:
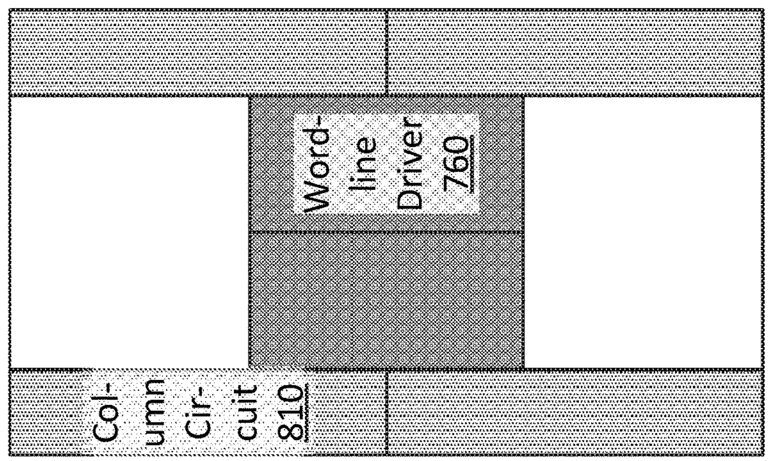
FIGS. 8B-8C are plan views of an example layout of a recessed thin-channel TFT-based embedded memory with overlap of the memory array and memory peripheral circuit, according to an embodiment of the present disclosure.
Figure 8B:
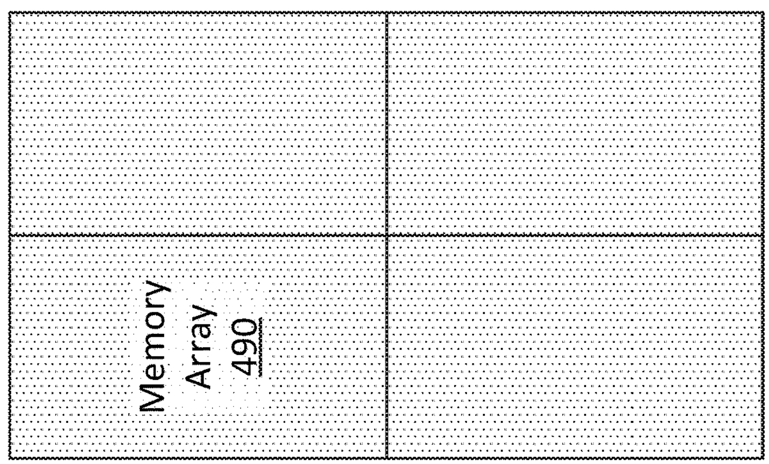
Figure 8A:
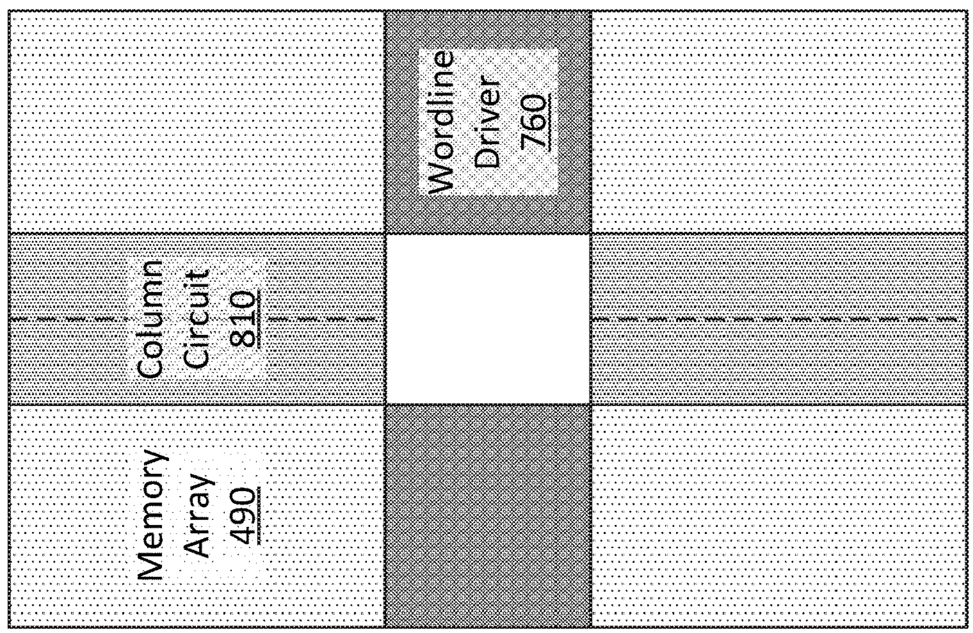
FIG. 8A is a plan view of an example layout of an embedded memory without overlap of the memory array and memory peripheral circuit.

FIG. 8A is a plan (Y-X) view of an example layout of an embedded memory without overlap of the memory array 490 and memory peripheral circuit (illustrated as wordline drivers 760 and column circuits 810). FIGS. 8B-8C are plan (Y-X) views of an example layout or floorplan of a recessed thin-channel TFT-based embedded memory with overlap of the memory array 490 and memory peripheral circuits 760 and 810, according to an embodiment of the present disclosure.

The column circuits 810 (or bitline drivers) include devices such as read (bitline) sense amplifiers 780 and precharging circuits. FIG. 8A shows the circuits spread out (e.g., occupying FEOL macro area or CMOS logic transistor area) and without overlap. By contrast, FIG. 8B shows the memory array 490 occupying the higher metal interconnection layers of the BEOL 420 (as illustrated in FIGS. 1-4 and 6A-7) and FIG. 8C shows the memory peripheral circuits 760 and 810 occupying the FEOL 410 and lower metal interconnection layers of the BEOL 420 underneath the memory array 490 (as illustrated in FIG. 4). Since more than 35% of the embedded memory macro area can be consumed by the peripheral (memory control) circuits, substantial savings of X-Y macro area can be saved by fabricating the memory arrays above the memory peripheral circuits, as in one or more embodiments of the present disclosure. Put another way, according to some embodiments of the present disclosure, an embedded memory is provided with memory cells only using space in the upper metal layers (e.g., metal 4 layer and above), the peripheral circuits being moved below the memory cells (e.g., in metal 3 layer and below, including the FEOL) and substantially reduce the memory area.

Figure 9:
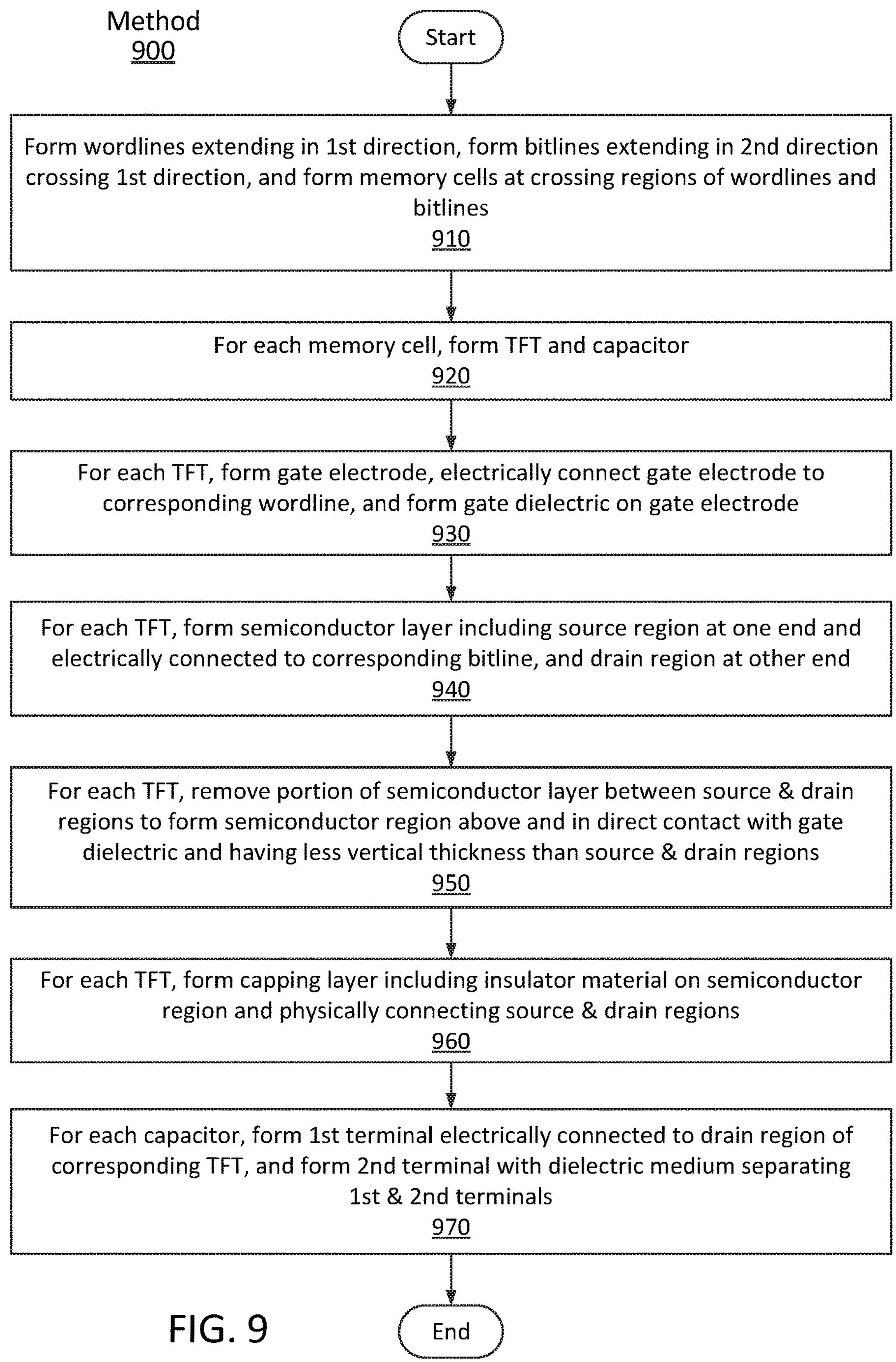
FIG. 9 illustrates an example method of fabricating a recessed thin-channel TFT-based memory array, according to an embodiment of the present disclosure.

FIG. 9 illustrates an example method 900 of fabricating a recessed thin-channel TFT-based memory array (e.g., a DRAM array, such as may be part of an eDRAM), according to an embodiment of the present disclosure. This and other methods disclosed herein may be carried out using integrated circuit fabrication techniques such as photolithography as would be apparent in light of the present disclosure. The corresponding memory cell and embedded memory including the memory cells may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal), either directly or indirectly (such as through one or more conductive layers in between).

Referring to FIG. 9 (with specific example references to the structures of FIGS. 1-4 and 6-8) method 900 includes forming 910 a plurality of wordlines (such as wordlines 720) extending in a first direction (such as an X-direction), forming a plurality of bitlines (such as bitlines 270 and 730) extending in a second direction (such as a Y-direction) crossing the first direction, and forming a plurality of memory cells (such as memory cells 200, 300, and 710) at crossing regions of the wordlines and the bitlines. For each memory cell, method 900 further includes forming 920 a recessed thin-channel TFT (such as thin-channel TFTs 100 and 740) and a capacitor (such as capacitors 290, 470, and 750).

For each thin-channel TFT, method 900 includes forming 930 a gate electrode (such as gate 120), electrically connecting the gate electrode to a corresponding one of the wordlines, and forming a gate dielectric (such as gate dielectric 130) on the gate electrode. For each thin-channel TFT, method 900 further includes forming 940 a semiconductor layer (such as active layer 140) including a source region (such as source region 142) at one end and electrically connected to a corresponding one of the bitlines, and a drain region, (such as drain region 144) at another end.

For each thin-channel TFT, method 900 further includes removing 950 a portion of the semiconductor layer between the source and drain regions to form a semiconductor region (such as channel region 146) above and in direct contact with the gate dielectric and having less vertical thickness than the source and drain regions. See, for example, the method of FIGS. 6A-6G for an example technique of performing such a channel recession. The semiconductor region physically connects the source and drain regions. For each thin-channel TFT, method 900 further includes forming 960 a capping layer (such as capping layer 170) including an insulator material on the recessed semiconductor region. For example, the capping layer can physically connect and electrically separate the source and drain regions. For each capacitor, method 900 includes forming 970 a first terminal (such as first terminals 292 and 392) electrically connected to the drain region of the corresponding thin-channel TFT, and forming a second terminal (such as second terminals 294 and 394) with a dielectric medium (such as dielectric media 296 and 396) electrically separating the first and second terminals.

While the above example methods appear as a series of operations or stages, it is to be understood that there is no required order to the operations or stages unless specifically indicated. For example, in various embodiments of method 900, for each memory cell, the electrically connecting 940 of the source region to a corresponding one of the bitlines can take place before, during, or after the recessing 950 of the semiconductor region and the forming 960 of the second layer on the recessed semiconductor region.

Example System

Figure 10:
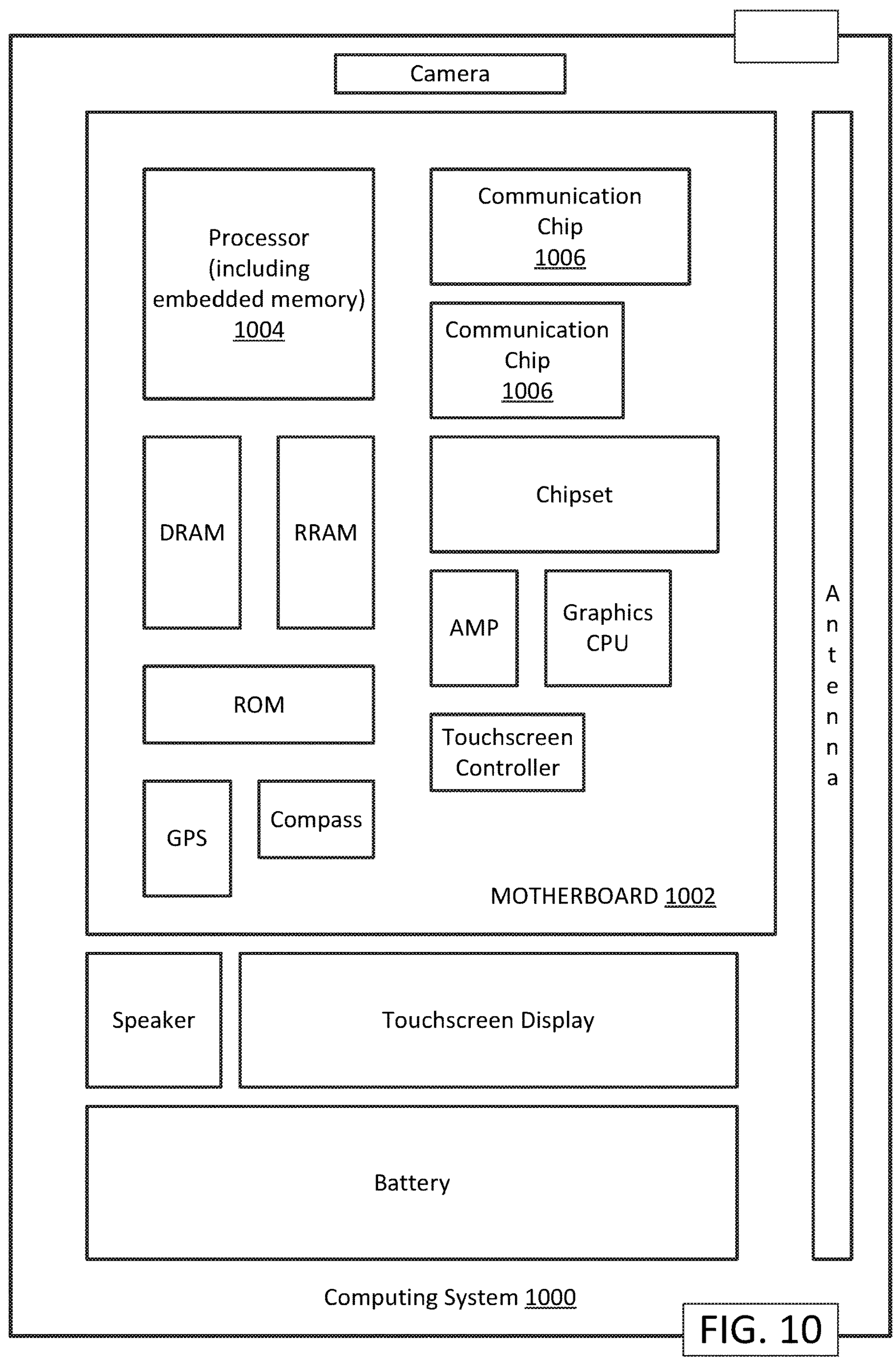
FIG. 10 illustrates an example computing system implemented with the integrated circuit structures or techniques disclosed herein, according to an embodiment of the present disclosure These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

FIG. 10 illustrates a computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including embedded memory, such as an eDRAM incorporating recessed thin-channel TFTs as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more memory cells) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., one or more memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., one or more memory cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more memory cells) formed using the disclosed techniques, as variously described herein.

Further Example Embodiments

The following examples pertain to further embodiments, from which numerous permutations and configurations will be apparent.

Example 1 is a thin-film transistor (TFT) including: a gate electrode; a gate dielectric on the gate electrode; a first layer including a source region, a drain region, and a semiconductor region above and in direct contact with the gate dielectric and physically connecting the source and drain regions, the semiconductor region having less vertical thickness than the source and drain regions; and a second layer including an insulator material on the semiconductor region.

Example 2 includes the TFT of Example 1, where the semiconductor region includes one or more of indium gallium zinc oxide (IGZO), indium zinc oxide (IZO), indium tin oxide (ITO), amorphous silicon (a-Si), zinc oxide, polysilicon, poly germanium, low-temperature polycrystalline silicon (LTPS), amorphous germanium (a-Ge), indium arsenide, copper oxide, and tin oxide.

Example 3 includes the TFT of Example 2, where the semiconductor region includes one or more of IGZO, IZO, a-Si, LTPS, and a-Ge.

Example 4 includes the TFT of any of Examples 1-3, where the insulator material includes one or more of aluminum oxide, gallium oxide, silicon nitride, silicon dioxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate.

Example 5 includes the TFT of Example 4, where the insulator material includes one or more of aluminum oxide, silicon nitride, titanium dioxide, hafnium dioxide, silicon oxynitride, and aluminum nitride.

Example 6 includes the TFT of any of Examples 1-5, where the thickness of the semiconductor region is no more than half that of the source and drain regions.

Example 7 includes the TFT of any of Examples 1-6, where the thickness of the semiconductor region is between 5 and 20 nanometers (nm).

Example 8 includes the TFT of any of Examples 1-7, where the second layer physically connects and electrically separates the source and drain regions.

Example 9 includes the TFT of Example 8, further including source and drain electrodes electrically connected to the source and drain regions, respectively, where the second layer physically connects and electrically separates the source and drain electrodes.

Example 10 includes the TFT of any of Examples 1-9, where the gate dielectric includes a high-κ dielectric.

Example 11 includes the TFT of Example 10, where the high-κ dielectric includes hafnium dioxide.

Example 12 includes the TFT of Example 11, where the gate dielectric has a thickness between 2 and 10 nanometers (nm).

Example 13 is a memory cell including: the TFT of any of Examples 1-12, the gate electrode being electrically connected to a wordline and the source region being electrically connected to a bitline; and a capacitor including a first terminal electrically connected to the drain region, a second terminal, and a dielectric medium electrically separating the first and second terminals.

Example 14 is a memory array including a plurality of wordlines extending in a first direction, a plurality of bitlines extending in a second direction crossing the first direction, and a plurality of memory cells at crossing regions of the wordlines and the bitlines, the memory cells including a first memory cell and a second memory cell, each of the first and second memory cells having a structure of the memory cell of Example 13, with the wordline being a corresponding one of the wordlines and the bitline being a corresponding one of the bitlines.

Example 15 is a backend TFT including the TFT of any of Examples 1-14, the backend TFT being electrically connected to a frontend circuit.

Example 16 is an embedded memory cell including: the backend TFT of Example 15, the gate electrode being electrically connected to a wordline and the source region being electrically connected to a bitline; and a capacitor including a first terminal electrically connected to the drain region, a second terminal, and a dielectric medium electrically separating the first and second terminals.

Example 17 includes the embedded memory cell of Example 16, where the frontend circuit includes a wordline driver electrically connected to the wordline and a sense amplifier electrically connected to the bitline.

Example 18 is an embedded memory including a plurality of wordlines extending in a first direction, a plurality of bitlines extending in a second direction crossing the first direction, and a plurality of embedded memory cells at crossing regions of the wordlines and the bitlines, the embedded memory cells including a first embedded memory cell and a second embedded memory cell, each of the first and second embedded memory cells having a structure of the embedded memory cell of any of Examples 16-17, with the wordline being a corresponding one of the wordlines and the bitline being a corresponding one of the bitlines.

Example 19 includes the embedded memory of Example 18, where the frontend circuit includes a plurality of wordline drivers electrically connected to the wordlines and a plurality of sense amplifiers electrically connected to the bitlines.

Example 20 is a memory cell including: a thin-film transistor (TFT) including a gate electrode electrically connected to a wordline, a gate dielectric on the gate electrode, an active layer on the gate dielectric and having a source region, a drain region electrically connected to a bitline, and a semiconductor region physically connecting the source and drain regions, the semiconductor region having less vertical thickness than the source and drain regions, and a capping layer on the semiconductor region and physically connecting the source and drain regions; and a capacitor including a first terminal electrically connected to the drain region, a second terminal, and a dielectric medium electrically separating the first and second terminals.

Example 21 includes the memory cell of Example 20, where the semiconductor region includes one or more of indium gallium zinc oxide (IGZO), indium zinc oxide (IZO), indium tin oxide (ITO), amorphous silicon (a-Si), zinc oxide, polysilicon, poly germanium, low-temperature polycrystalline silicon (LTPS), amorphous germanium (a-Ge), indium arsenide, copper oxide, and tin oxide.

Example 22 includes the memory cell of Example 21, where the semiconductor region includes one or more of IGZO, IZO, a-Si, LTPS, and a-Ge.

Example 23 includes the memory cell of any of Examples 20-22, where the capping layer includes one or more of aluminum oxide, gallium oxide, silicon nitride, silicon dioxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate.

Example 24 includes the memory cell of Example 23, where the capping layer includes one or more of aluminum oxide, silicon nitride, titanium dioxide, hafnium dioxide, silicon oxynitride, and aluminum nitride.

Example 25 includes the memory cell of any of Examples 20-24, where the thickness of the semiconductor region is no more than half that of the source and drain regions.

Example 26 includes the memory cell of any of Examples 20-25, where the thickness of the semiconductor region is between 5 and 20 nanometers (nm).

Example 27 includes the memory cell of any of Examples 20-26, where the capping layer electrically separates the source and drain regions.

Example 28 includes the memory cell of Example 27, further including source and drain electrodes electrically connected to the source and drain regions, respectively, where the capping layer physically connects and electrically separates the source and drain electrodes.

Example 29 includes the memory cell of any of Examples 20-28, where the gate dielectric includes a high-κ dielectric.

Example 30 includes the memory cell of Example 29, where the high-κ dielectric includes hafnium dioxide.

Example 31 includes the memory cell of Example 30, where the gate dielectric has a thickness between 2 and 10 nanometers (nm).

Example 32 is a memory array including a plurality of wordlines extending in a first direction, a plurality of bitlines extending in a second direction crossing the first direction, and a plurality of memory cells at crossing regions of the wordlines and the bitlines, the memory cells including a first memory cell and a second memory cell, each of the first and second memory cells having a structure of the memory cell of any of Examples 20-31, with the wordline being a corresponding one of the wordlines and the bitline being a corresponding one of the bitlines.

Example 33 is an embedded memory cell including the memory cell of any of Examples 20-31, the TFT being a backend TFT electrically connected to a frontend circuit, the frontend circuit including a wordline driver electrically connected to the wordline and a sense amplifier electrically connected to the bitline.

Example 34 is an embedded memory including a plurality of wordlines extending in a first direction, a plurality of bitlines extending in a second direction crossing the first direction, and a plurality of embedded memory cells at crossing regions of the wordlines and the bitlines, the embedded memory cells including a first embedded memory cell and a second embedded memory cell, each of the first and second embedded memory cells having a structure of the embedded memory cell of Example 33, with the wordline being a corresponding one of the wordlines and the bitline being a corresponding one of the bitlines.

Example 35 includes the embedded memory of Example 34, where the frontend circuit further includes a plurality of wordline drivers electrically connected to the wordlines, and a plurality of sense amplifiers electrically connected to the bitlines.

Example 36 is a method of fabricating a thin-film transistor (TFT), the method including: forming a gate electrode; forming a gate dielectric on the gate electrode; forming a first layer including a source region, a drain region, and a semiconductor region above and in direct contact with the gate dielectric and physically connecting the source and drain regions, the semiconductor region having less vertical thickness than the source and drain regions; and forming a second layer including an insulator material on the semiconductor region.

Example 37 includes the method of Example 36, where the forming of the first layer includes: forming a semiconductor layer on the gate dielectric; and removing a portion of the semiconductor layer between the source and drain regions to form the semiconductor region.

Example 38 includes the method of Example 37, where the removing of the portion of the semiconductor layer includes removing at least half of the semiconductor layer between the source and drain regions.

Example 39 includes the method of any of Examples 37-38, where the removing of the portion of the semiconductor layer includes recessing the semiconductor layer so that the thickness of the semiconductor region is between 5 and 20 nanometers (nm).

Example 40 includes the method of any of Examples 37-39, where the forming of the first layer further includes forming source and drain electrodes on and electrically connected to the source and drain regions, respectively, and the removing of the portion of the semiconductor layer includes recessing an exposed portion of the semiconductor layer between the formed source and drain electrodes.

Example 41 includes the method of Example 40, where the forming of the second layer includes forming the insulator material on the semiconductor region to physically connect and electrically separate the source and drain electrodes.

Example 42 includes the method of any of Examples 36-41, where the semiconductor region includes one or more of indium gallium zinc oxide (IGZO), indium zinc oxide (IZO), indium tin oxide (ITO), amorphous silicon (a-Si), zinc oxide, polysilicon, poly germanium, low-temperature polycrystalline silicon (LTPS), amorphous germanium (a-Ge), indium arsenide, copper oxide, and tin oxide.

Example 43 includes the method of Example 42, where the semiconductor region includes one or more of IGZO, IZO, a-Si, LTPS, and a-Ge.

Example 44 includes the method of any of Examples 36-43, where the insulator material includes one or more of aluminum oxide, gallium oxide, silicon nitride, silicon dioxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate.

Example 45 includes the method of Example 44, where the insulator material includes one or more of aluminum oxide, silicon nitride, titanium dioxide, hafnium dioxide, silicon oxynitride, and aluminum nitride.

Example 46 includes the method of any of Examples 36-45, where the second layer physically connects and electrically separates the source and drain regions.

Example 47 includes the method of any of Examples 36-46, where the gate dielectric includes a high-κ dielectric.

Example 48 includes the method of Example 47, where the high-κ dielectric includes hafnium dioxide.

Example 49 includes the method of Example 48, where the gate dielectric has a thickness between 2 and 10 nanometers (nm).

Example 50 is a method of fabricating a memory cell, the method including: fabricating the TFT by the method of any of Examples 36-49; electrically connecting the gate electrode to a wordline; electrically connecting the source region being to a bitline; forming a capacitor including first and second terminals, and a dielectric medium electrically separating the first and second terminals; and electrically connecting the first terminal to the drain region.

Example 51 is a method of fabricating a memory array, the method including: forming a plurality of wordlines extending in a first direction; forming a plurality of bitlines extending in a second direction crossing the first direction; and forming a plurality of memory cells at crossing regions of the wordlines and the bitlines, the memory cells including a first memory cell and a second memory cell, each of the first and second memory cells being fabricated by the method of Example 50, with the wordline being a corresponding one of the wordlines and the bitline being a corresponding one of the bitlines.

Example 52 is a method of fabricating a backend TFT, the method including: fabricating the TFT by the method of any of Examples 36-49; and electrically connecting the TFT to a frontend circuit.

Example 53 is a method of fabricating an embedded memory cell, the method including: fabricating the backend TFT by the method of Example 52; electrically connecting the gate electrode to a wordline; electrically connecting the source region to a bitline; forming a capacitor including first and second terminals, a second terminal, and a dielectric medium electrically separating the first and second terminals; and electrically connecting the first terminal to the drain region.

Example 54 includes the method of Example 53, where the frontend circuit includes a wordline driver and a sense amplifier, and the method further includes electrically connecting the wordline to the wordline driver and the bitline to the sense amplifier.

Example 55 is a method of fabricating an embedded memory, the method including: forming a plurality of wordlines extending in a first direction; forming a plurality of bitlines extending in a second direction crossing the first direction; and forming a plurality of embedded memory cells at crossing regions of the wordlines and the bitlines, the embedded memory cells including a first embedded memory cell and a second embedded memory cell, each of the first and second embedded memory cells being fabricated by the method of any of Examples 53-54, with the wordline being a corresponding one of the wordlines and the bitline being a corresponding one of the bitlines.

Example 56 includes the method of Example 55, where the frontend circuit includes a plurality of wordline drivers and a plurality of sense amplifiers, and the method further includes electrically connecting the wordlines to the wordline drivers and the bitlines to the sense amplifiers.

Example 57 is an integrated circuit (IC) structure including: a gate electrode; a gate dielectric on the gate electrode; a semiconductor region above and in direct contact with the gate dielectric; a capping structure on the semiconductor region; and a source region and a drain region each adjacent to a different portion of and having a greater vertical thickness than the semi conductor region.

Example 58 includes the IC structure of Example 57, where the semiconductor region includes one or more of indium gallium zinc oxide (IGZO), indium zinc oxide (IZO), indium tin oxide (ITO), amorphous silicon (a-Si), zinc oxide, polysilicon, poly germanium, low-temperature polycrystalline silicon (LTPS), amorphous germanium (a-Ge), indium arsenide, copper oxide, and tin oxide.

Example 59 includes the IC structure of Example 58, where the semiconductor region includes one or more of IGZO, IZO, a-Si, LTPS, and a-Ge.

Example 60 includes the IC structure of any of Examples 57-59, where the capping structure includes one or more of aluminum oxide, gallium oxide, silicon nitride, silicon dioxide, titanium dioxide, hafnium dioxide, silicon oxynitride, aluminum silicate, tantalum oxide, hafnium tantalum oxide, aluminum nitride, aluminum silicon nitride, sialon, zirconium dioxide, hafnium zirconium oxide, tantalum silicate, and hafnium silicate.

Example 61 includes the IC structure of Example 60, where the capping structure includes one or more of aluminum oxide, silicon nitride, titanium dioxide, hafnium dioxide, silicon oxynitride, and aluminum nitride.

Example 62 includes the IC structure of any of Examples 57-61, where the thickness of the semiconductor region is no more than half that of the source region or the drain region.

Example 63 includes the IC structure of any of Examples 57-62, where the thickness of the semiconductor region is between 5 and 20 nanometers (nm).

Example 64 includes the IC structure of any of Examples 57-63, where the gate dielectric includes a high-κ dielectric.

Example 65 includes the IC structure of Example 64, where the high-κ dielectric includes hafnium dioxide.

Example 66 includes the IC structure of Example 65, where the gate dielectric has a thickness between 2 and 10 nanometers (nm).

Example 67 includes the IC structure of any of Examples 57-66, where the capping structure physically connects and electrically separates the source and drain regions.

Example 68 includes the IC structure of Example 67, further including source and drain electrodes electrically connected to the source and drain regions, respectively, where the capping structure physically connects and electrically separates the source and drain electrodes.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) structure comprising:

a gate electrode;

a gate dielectric on the gate electrode;

a region comprising semiconductor material above and in direct contact with the gate dielectric;

a structure on the region comprising semiconductor material, the structure comprising insulator material; and a source region and a drain region each comprising semiconductor material and adjacent to a different portion of the region comprising semiconductor material, the source and drain regions each having a greater vertical thickness than the region, such that at least a portion of the structure is laterally between respective portions of the source and drain regions, wherein the gate electrode extends vertically beneath the source region and the drain region.

2. The IC structure of claim 1, wherein the semiconductor region comprises one or more of indium, gallium, zinc, tin, oxygen, amorphous silicon (a-Si), polysilicon, poly germanium, low-temperature polycrystalline silicon (LTPS), amorphous germanium (a-Ge), arsenic, and copper.

3. The IC structure of claim 1, wherein the semiconductor region comprises one or more of indium gallium zinc oxide (IGZO), indium zinc oxide (IZO), amorphous silicon (a-Si), low-temperature polycrystalline silicon (LTPS), and amorphous germanium (a-Ge).

4. The IC structure of claim 1, wherein the structure comprises one or more of aluminum, gallium, silicon, titanium, hafnium, tantalum, sialon, zirconium, oxygen, and nitrogen.

5. The IC structure of claim 1, wherein the structure comprises one or more of aluminum oxide, silicon nitride, titanium dioxide, hafnium dioxide, silicon oxynitride, and aluminum nitride.

6. The IC structure of claim 1, wherein the thickness of the region comprising semiconductor material is no more than half that of the source region or the drain region.

7. The IC structure of claim 1, wherein the thickness of the region comprising semiconductor material is between 5 and 20 nanometers (nm).

8. The IC structure of claim 1, wherein the gate dielectric comprises a high-K dielectric.

9. The IC structure of claim 8, wherein the high-.kappa. dielectric comprises hafnium and oxygen.

10. The IC structure of claim 9, wherein the gate dielectric has a thickness between 2 and 10 nanometers (nm).

11. The IC structure of claim 1, further comprising source and drain electrodes electrically connected to the source and drain regions, respectively, wherein the structure physically connects and electrically separates the source and drain electrodes.

12. A thin-film transistor (TFT) comprising:

a gate electrode;

a gate dielectric on the gate electrode;

a first layer comprising semiconductor material and including a source region, a drain region, and a region between the source and drain regions, the first layer above and in direct contact with the gate dielectric, the region having less vertical thickness than the source and drain regions, wherein the gate electrode extends vertically beneath the source region and the drain region; and a second layer including an insulator material on the region, the second layer being at least partially between the source and drain regions and completely above the region between the source and drain regions.

13. A memory cell comprising:

the TFT of claim 12, the gate electrode being electrically connected to a wordline and the source region being electrically connected to a bitline; and a capacitor including a first terminal electrically connected to the drain region, a second terminal, and a dielectric medium electrically separating the first and second terminals.

14. A memory array comprising a plurality of wordlines extending in a first direction, a plurality of bitlines extending in a second direction orthogonal to the first direction, and a plurality of memory cells each between crossing regions of corresponding wordlines and the bitlines, the memory cells including a first memory cell and a second memory cell, each of the first and second memory cells having a structure of the memory cell of claim 13, with the wordline being a corresponding one of the wordlines and the bitline being a corresponding one of the bitlines.

15. An embedded memory cell comprising:

a backend TFT of claim 12, the backend TFT being electrically connected to a frontend circuit, the gate electrode being electrically connected to a wordline and the source region being electrically connected to a bitline; and a capacitor including a first terminal electrically connected to the drain region, a second terminal, and a dielectric medium electrically separating the first and second terminals.

16. The embedded memory cell of claim 15, wherein the frontend circuit comprises a wordline driver electrically connected to the wordline and a sense amplifier electrically connected to the bitline.

17. An embedded memory comprising a plurality of wordlines extending in a first direction, a plurality of bitlines extending in a second direction crossing the first direction, and a plurality of embedded memory cells at crossing regions of the wordlines and the bitlines, the embedded memory cells including a first embedded memory cell and a second embedded memory cell, each of the first and second embedded memory cells having a structure of the embedded memory cell of claim 15, with the wordline being a corresponding one of the wordlines and the bitline being a corresponding one of the bitlines.

18. The embedded memory of claim 17, wherein the frontend circuit comprises a plurality of wordline drivers electrically connected to the wordlines and a plurality of sense amplifiers electrically connected to the bitlines.

19. An integrated circuit (IC) structure comprising:

a gate electrode;

a gate dielectric on the gate electrode;

a first region, a second region, and a third region, each comprising semiconductor material and being above and in direct contact with the gate dielectric, wherein the second region is directly between the first and third regions, and the first and third regions each have a greater vertical thickness than the second region, wherein the gate electrode extends vertically beneath the first region and the third region;

a structure on the second region and comprising insulator material, such that at least a portion of the structure is between respective sidewalls of the first and third regions; and a source electrode above and on the first region, and a drain electrode above and on the third region.

20. The IC structure of claim 19, wherein the first, second, and third regions are part of an active layer of a thin film transistor.

* * * * *